(12) United States Patent
Lee et al.

(10) Patent No.: US 12,512,319 B2
(45) Date of Patent: Dec. 30, 2025

(54) PHOTORESIST AND FORMATION METHOD THEREOF

(71) Applicant: TAIWAN SEMICONDUCTOR MANUFACTURING COMPANY, LTD., Hsinchu (TW)

(72) Inventors: Hui-Chun Lee, Hsinchu (TW); Tung-Hung Feng, Hsinchu (TW); Peng-Ting Lee, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 423 days.

(21) Appl. No.: 18/155,955

(22) Filed: Jan. 18, 2023

(65) Prior Publication Data
US 2024/0242966 A1    Jul. 18, 2024

(51) Int. Cl.
| | | |
|---|---|---|
| *H01L 21/033* | (2006.01) | |
| *G03F 7/004* | (2006.01) | |
| *G03F 7/16* | (2006.01) | |
| *G03F 7/38* | (2006.01) | |
| *G03F 7/40* | (2006.01) | |
| *H01L 21/027* | (2006.01) | |
| *H01L 21/3213* | (2006.01) | |
| *H01L 21/308* | (2006.01) | |
| *H01L 21/311* | (2006.01) | |

(52) U.S. Cl.
CPC ........ *H01L 21/0337* (2013.01); *G03F 7/0042* (2013.01); *G03F 7/0044* (2013.01); *G03F 7/167* (2013.01); *G03F 7/168* (2013.01); *G03F 7/38* (2013.01); *G03F 7/40* (2013.01); *H01L 21/0273* (2013.01); *H01L 21/0274* (2013.01); *H01L 21/32139* (2013.01); *H01L 21/3086* (2013.01); *H01L 21/31144* (2013.01)

(58) Field of Classification Search
None
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 8,945,803 B2 | 2/2015 | Chen et al. |
| 8,987,689 B2 | 3/2015 | Chen et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,269,537 B2 | 2/2016 | Tseng et al. |

(Continued)

FOREIGN PATENT DOCUMENTS

| | | | | |
|---|---|---|---|---|
| CA | 1333461 | * | 8/1988 | ............. C03C 17/34 |
| WO | WO2022103764 | * | 5/2022 | ............. H01L 21/67 |

*Primary Examiner* — Jiong-Ping Lu
(74) *Attorney, Agent, or Firm* — Birch, Stewart, Kolasch & Birch, LLP

(57) ABSTRACT

A method of manufacturing a semiconductor device includes the following steps. A photoresist layer is formed over a material layer on a substrate. The photoresist layer is exposed. An organic treatment to the photoresist layer is performed. After performing the organic treatment, the photoresist layer is developed. The material layer is etched using the photoresist layer as a mask.

20 Claims, 27 Drawing Sheets

(56) References Cited

U.S. PATENT DOCUMENTS

| | | |
|---|---|---|
| 9,305,799 B2 | 4/2016 | Chen et al. |
| 9,336,993 B2 | 5/2016 | Yu |
| 9,367,661 B2 | 6/2016 | Jou et al. |
| 9,529,268 B2 | 12/2016 | Chang et al. |
| 9,529,959 B2 | 12/2016 | Wang et al. |
| 9,548,303 B2 | 1/2017 | Lee et al. |
| 2022/0004105 A1* | 1/2022 | Dai .................. G03F 7/162 |
| 2022/0035247 A1* | 2/2022 | Tan ............... H01L 21/02274 |

* cited by examiner

| Chemical of Organic treatment | ADI trench CD (nm) |
|---|---|
| NA | REF |
| Toluene | >-1.5 |

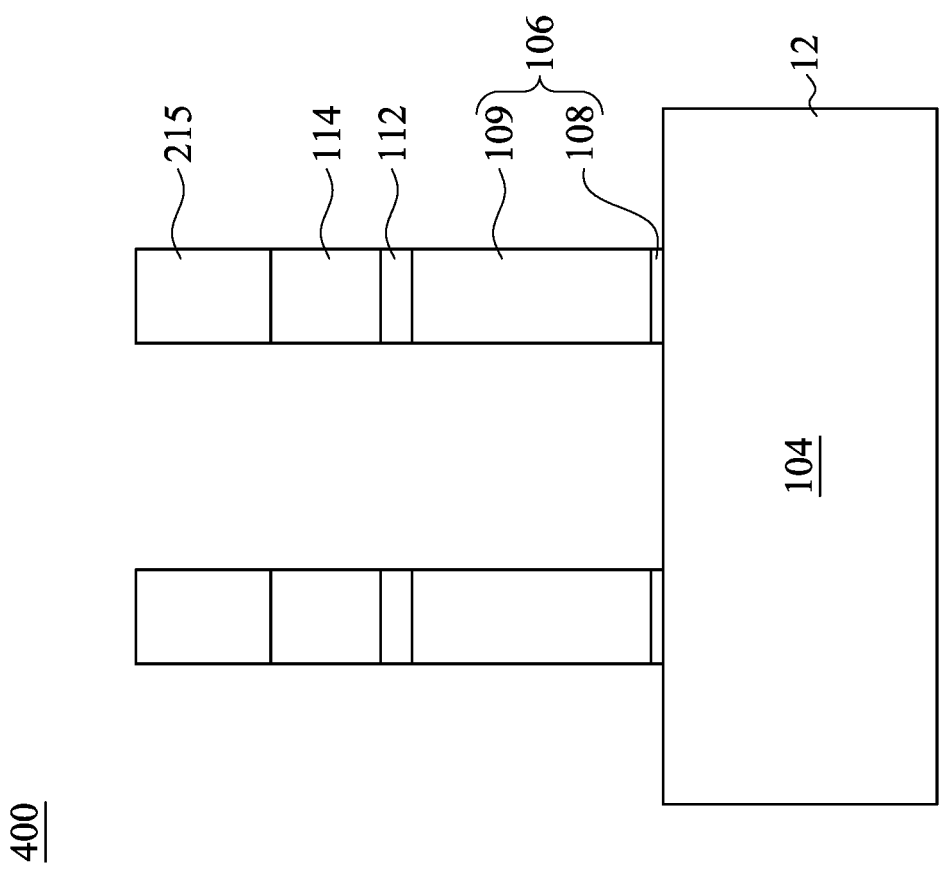

PHOTORESIST AND FORMATION METHOD THEREOF

BACKGROUND

As modern integrated circuits shrink in size, the associated features shrink in size as well. Lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Semiconductor photolithography typically includes the steps of applying a coating of photoresist (also referred to as resist) on a top surface (e.g., a thin film stack) of a semiconductor wafer and exposing the photoresist to a pattern. The semiconductor wafer is then transferred to a developing chamber to remove the exposed resist, which is soluble to an aqueous developer solution. As a result, a patterned layer of photoresist exists on the top surface of the wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 11C is a table that shows experimental data comparing after development inspection (ADI) trench critical dimension (CD) of the photoresist layer and the patterned photoresist in accordance with some embodiments.

FIGS. 21B, 22, 23 and 24 illustrate cross-sectional views of additional fabrication processes in the formation of a semiconductor device using a substrate in accordance with some embodiments of the present disclosure.

DETAILED DESCRIPTION

Figure 1A:
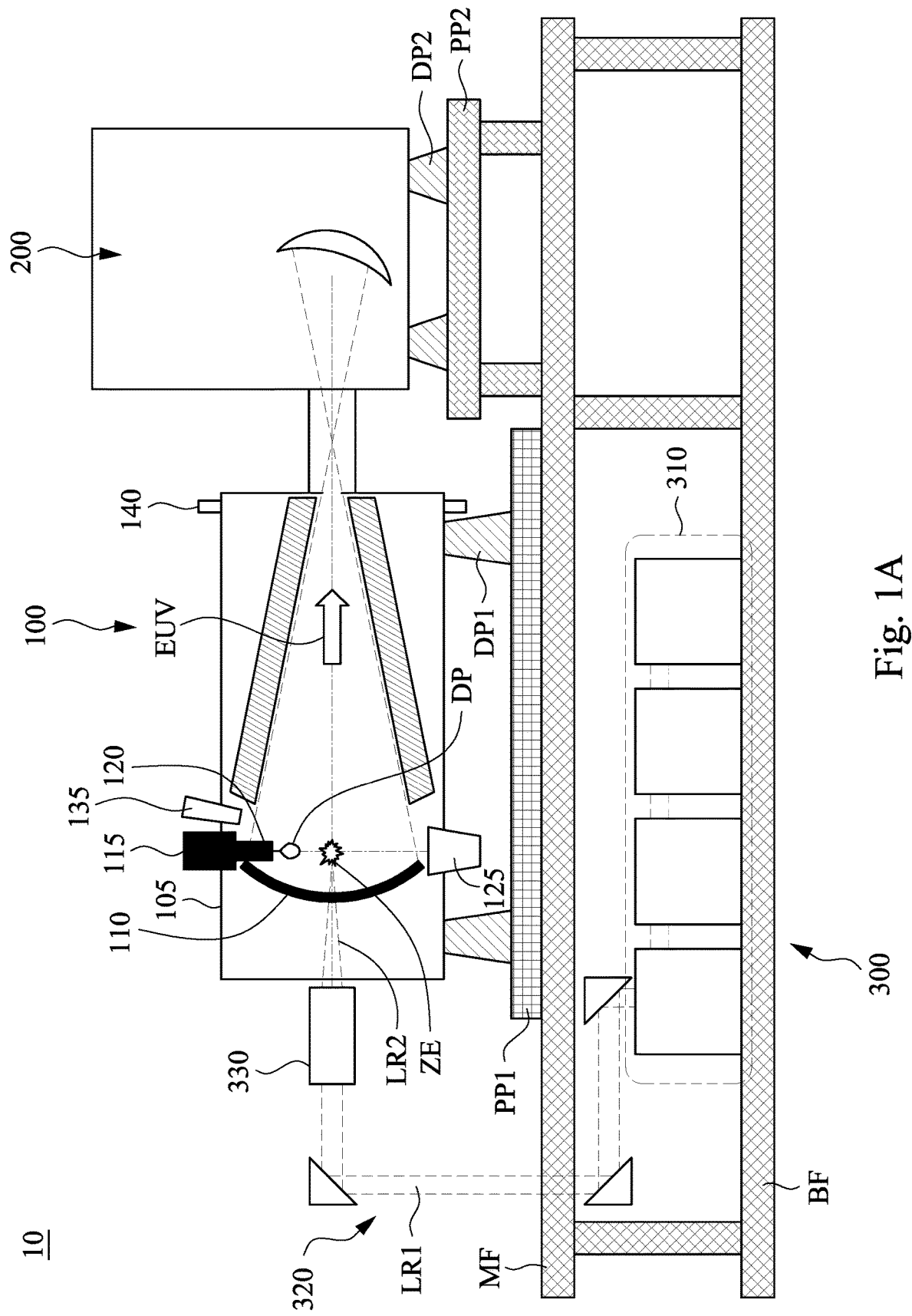
FIG. 1A is a schematic view of an EUV lithography tool with an LPP-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1A is a schematic view of an EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by an EUV light or EUV radiation. The photoresist layer is a material sensitive to the EUV light. The EUV lithography system 10 employs a radiation source 100 to generate EUV light, such as EUV light having a wavelength ranging between about 1 nm and about 100 nm. In one particular example, the radiation source 100 generates a EUV light with a wavelength centered at about 13.5 nm. Accordingly, the radiation source 100 is also referred to as EUV radiation source 100.

Extreme ultraviolet (EUV) lithography has become widely used due to its ability to achieve small semiconductor device sizes, for example, for 20 nanometer (nm) technology nodes. To achieve small pitches using chemical amplified resist (CAR), multiple EUV patterning processes are required. Metal containing photoresists have been developed for improved EUV light absorption and enhanced resolution. Therefore, by using metallic resist in EUV lithography, an amount of process layers to obtain the same pattern dimension can be achieved. However, for EUV exposure, an energy dosage required is high and thus is not cost effective.

The present disclosure provides a method of treating the photoresist layer with an organic compound to enhance a crosslink reaction of the photoresist. Therefore, the energy dosage for the EUV exposure is reduced, and thus cost of operation (CoO) is reduced. The various aspects of the present disclosure will be discussed below in greater detail with reference to FIGS. 1A-24. First, an EUV lithography system will be discussed below with reference to FIGS. 1A, 1B and 2. Next, the details of the lithography process will be discussed with reference to FIGS. 3-24.

The advanced lithography process, method, and materials described in the current disclosure can be used in many applications, including fin-type field effect transistors (FinFETs), gate-all-around (GAA) FETs. For example, the fins may be patterned to produce a relatively close spacing between features, for which the above disclosure is well suited. In addition, spacers used in forming fins of FinFETs can be processed according to the above disclosure.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1A is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
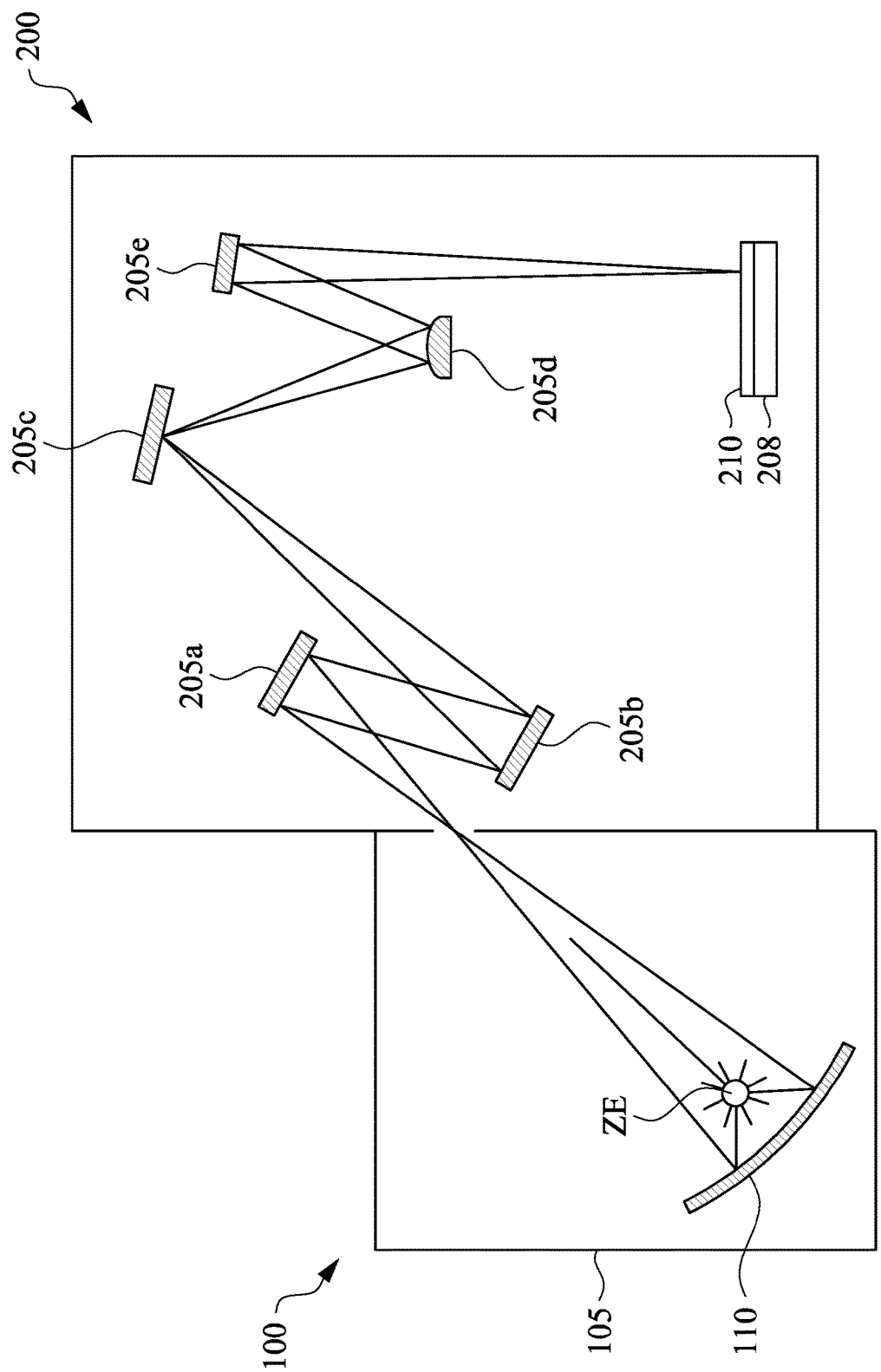
FIG. 1B is a simplified schematic diagram of a detail of an extreme ultraviolet lithography tool according to an embodiment of the disclosure showing the exposure of photoresist coated substrate with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the photoresist coated substrate 210. A mechanical assembly (not shown) may be provided for generating a controlled relative movement between the photoresist coated substrate 210 and the patterning optic 205c. As further shown in FIG. 2, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength. In various embodiments of the present disclosure, the photoresist coated substrate 210 is a semiconductor wafer, such as a silicon wafer or other type of wafer to be patterned. The EUVL tool further includes other modules or is integrated with (or coupled with) other modules in some embodiments.

As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1A, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In the present disclosure, the terms mask, photomask, and reticle are used interchangeably. In the present embodiment, the patterning optic 205c is a reflective mask 205c. The reflective mask 205c also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 205c may further include a capping layer, such as ruthenium (Ru), disposed on the ML for protection. The mask 205c further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The mask 205c and the method making the same are further described in accordance with some embodiments. In some embodiments, the mask fabrication process includes two operations: a blank mask fabrication process and a mask patterning process. During the blank mask fabrication process, a blank mask is formed by depositing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

Figure 2:
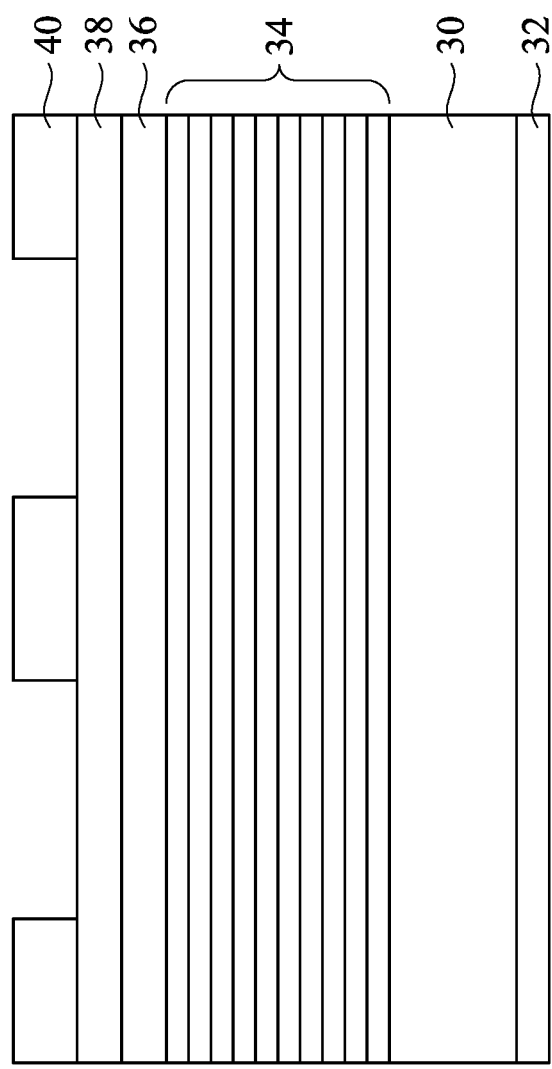
FIG. 2 is a sectional view of a EUV mask constructed in accordance with some embodiments of the present disclosure.

One example of the reflective mask 205c is shown in FIG. 2. The reflective mask 205c in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The reflective mask 205c includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 205c also includes a capping layer 36 disposed over the ML structure 34 to prevent oxidation of the ML. The EUV mask 205c may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 205c also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

FIGS. 3, 4, 5, 10 and 13 are diagrammatic fragmentary cross-sectional side views of a semiconductor device 45 at various stages of fabrication in accordance with various aspects of the present disclosure. The semiconductor device 45 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Figure 3:
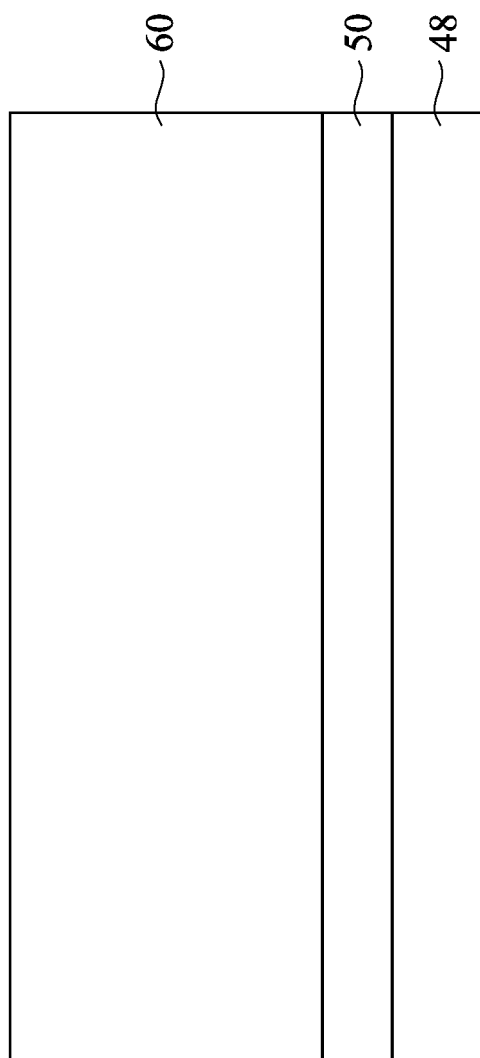
FIGS. 3, 4 and 5 are diagrammatic fragmentary cross-sectional side views of a semiconductor device at various stages of fabrication in accordance with various aspects of the present disclosure.

Referring to FIG. 3, a semiconductor device 45 includes a substrate 48. In some embodiments, the substrate 48 is a silicon substrate doped with a p-type dopant such as boron (for example a p-type substrate). Alternatively, the substrate 48 could be another suitable semiconductor material. For example, the substrate 48 may be a silicon substrate that is doped with an n-type dopant such as phosphorous or arsenic (an n-type substrate). The substrate 48 could include other elementary semiconductors such as germanium and diamond. The substrate 48 could optionally include a compound semiconductor and/or an alloy semiconductor. Further, the substrate 48 could include an epitaxial layer (epi layer), may be strained for performance enhancement, and may include a silicon-on-insulator (SOI) structure.

In some embodiments, the substrate 48 is substantially conductive or semi-conductive. The electrical resistance may be less than about 103 ohm-meter. In some embodiments, the substrate 48 contains metal, metal alloy, or metal nitride/sulfide/selenide/oxide/silicide with the formula $MX_a$, where M is a metal, and X is N, S, Se, O, Si, and where "a" is in a range from about 0.4 to 2.5. For example, the substrate 48 may contain Ti, Al, Co, Ru, TiN, $WN_2$, or TaN.

In some other embodiments, the substrate 48 contains a dielectric material with a dielectric constant in a range from about 1 to about 40. In some other embodiments, the substrate 48 contains Si, metal oxide, or metal nitride, where the formula is $MX_b$, wherein M is a metal or Si, and X is N or O, and wherein "b" is in a range from about 0.4 to 2.5. For example, the substrate 48 may contain $SiO_2$, silicon nitride, aluminum oxide, hafnium oxide, or lanthanum oxide.

A material layer 50 is formed over the substrate 48. The material layer 50 can be patterned via a lithography process and as such may also be referred to as a patternable layer. In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 and the overlying photoresist layer have different etching resistance. In some embodiments, the material layer 50 contains an etching resistant molecule. It is understood that the substrate 48 and the material layer 50 may each include additional suitable material compositions in other embodiments.

A photoresist layer 60 is formed over the material layer 50. The photoresist layer 60 may be formed by a spin-coating process. The photoresist layer 60 includes a solvent and one or more photo-active compounds dissolved in the solvent. The solvent includes an appropriate organic solvent for an adjustment of its viscosity. The one or more photo-active compounds may include metallic resists. In other words, the one or more photo-active compounds are metal containing photoresist, such as metal oxide/ligand complex formed of a cluster including a metallic core having a metal with high EUV absorption, such as Cs, Ba, La, Ce, In, Sn, Ag, or Sb combined with oxygen and/or nitrogen to form 1 to 12 metal core-clusters. The metallic core-clusters are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen in some embodiments. In other words, the one or more photo-active compounds may include a metallic cation bonded to an organic ligand (i.e., a carbon-containing ligand) such that metal-carbon bonds are present in the one or more photo-active compounds.

Figure 4:
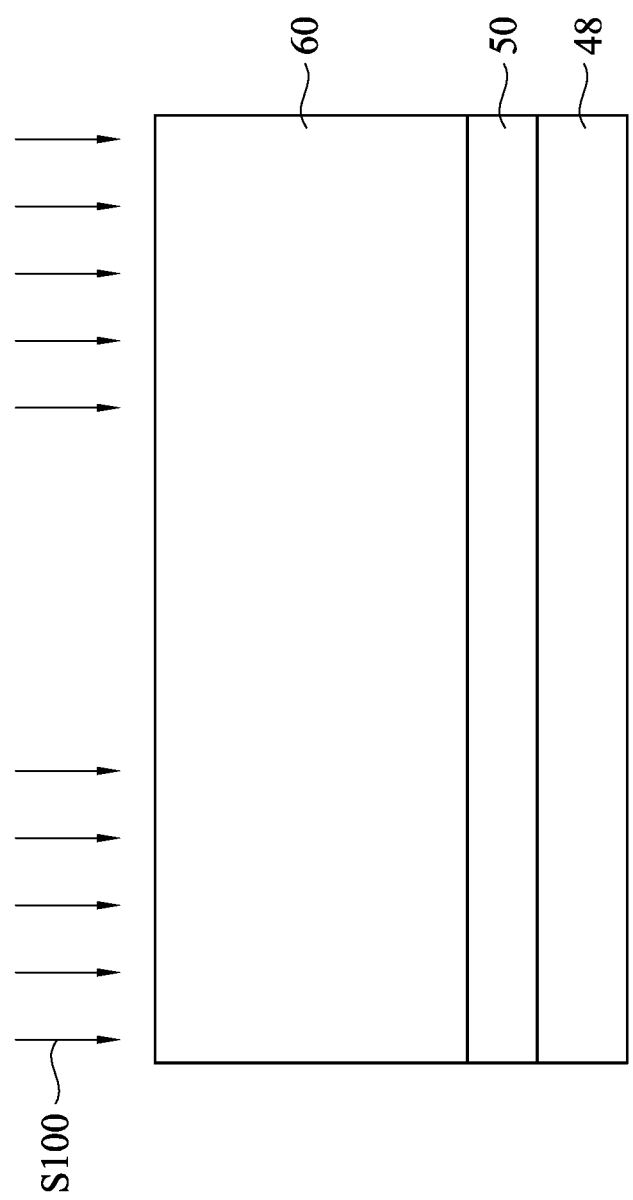

Referring to FIG. 4, an exposure process S100 is performed to expose the photoresist layer 60 to an EUV radiation. The exposure process S100 applies the EUV radiation to a region of the photoresist layer 60 so that a region (that is, an exposed region) of the photoresist layer 60 undergoes a crosslinking reaction. Under the EUV radiation, the metallic cation of the one or more photo-active compounds can gain EUV photons. For example, in some embodiments where the metallic cation is tin, the one or more photo-active compounds include a tin cation bonded to the organic ligand such that tin-carbon bonds are present in the one or more photo-active compounds. The tin-carbon bonds are weak, and tin forms stable radicals. During the exposure process S100, the EUV radiation can cause homolysis of the tin-carbon bonds. The homolytic cleavage of the tin-carbon bonds would produce tin-centered radicals which could initiate reactions with an adjacent one of the one or more photo-active compounds, creating cross-linked photo-active compounds. The exposed region of the photoresist layer 60 become less soluble in a developer as compared to a non-exposed region of the photoresist layer 60 and thereby exhibits properties of a negative-tone photoresist.

Figure 5:
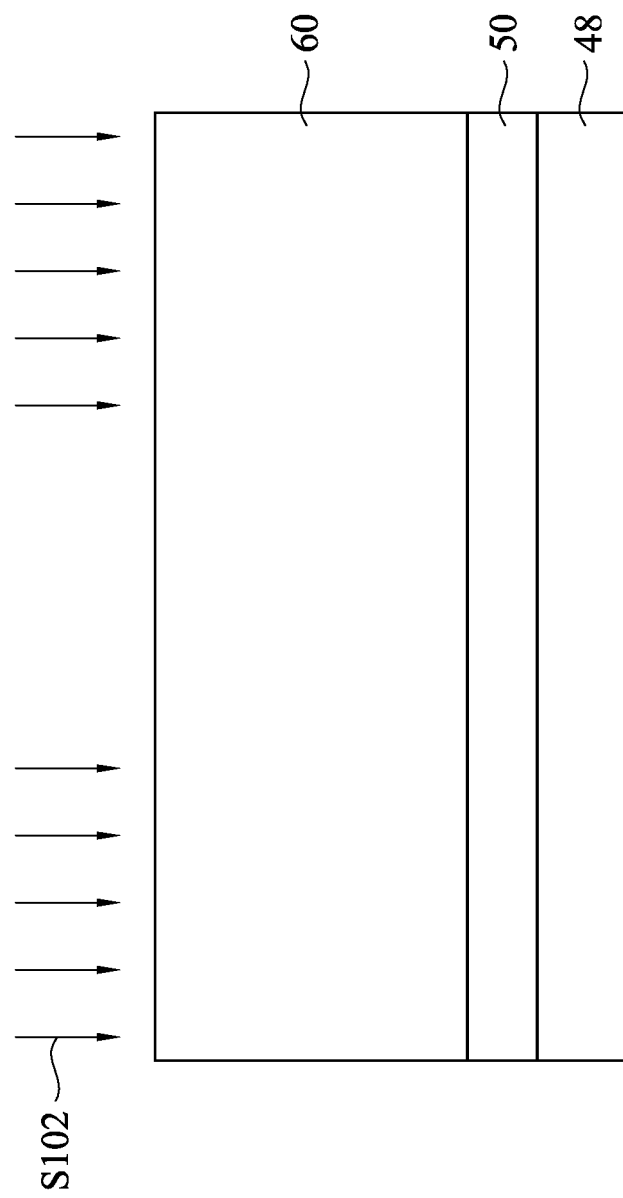

Reference is made to FIG. 5. After the exposure process S100, an organic treatment S102 is performed to the photoresist layer 60 to enhance the homolytic cleavage of the tin-carbon bonds such that more tin-centered radicals are produced, resulting in enhanced crosslinking reaction of the photoresist layer 60. Therefore, the energy dosage required for the EUV exposure in the exposure process S100 as discussed previously with regard to FIG. 4 can be reduced, and hence cost of operation (CoO) can be reduced under use of the metallic resist.

In some embodiments, the organic treatment S102 is performed using an organic compound such as benzene, derivatives of benzene, or a combination thereof. An illustrative example of the derivatives of benzene may be

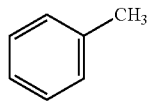

methylbenzene (or toluene).

In some other embodiments, derivatives of benzene may be ethylbenzene, propylbenzene, isopropylbenzene (or cumene), hydroxybenzene (or phenol), benzaldehyde, carboxybenzene (or benzoic acid), aminobenzene (or aniline), nitrobenzene, sulfobenzol, thiophenol (or phenyl mercaptan), chlorobenzene (or phenyl chloride), bromobenzene (or phenyl bromide), iodobenzene (or phenyl iodide), or the like.

Figure 6:
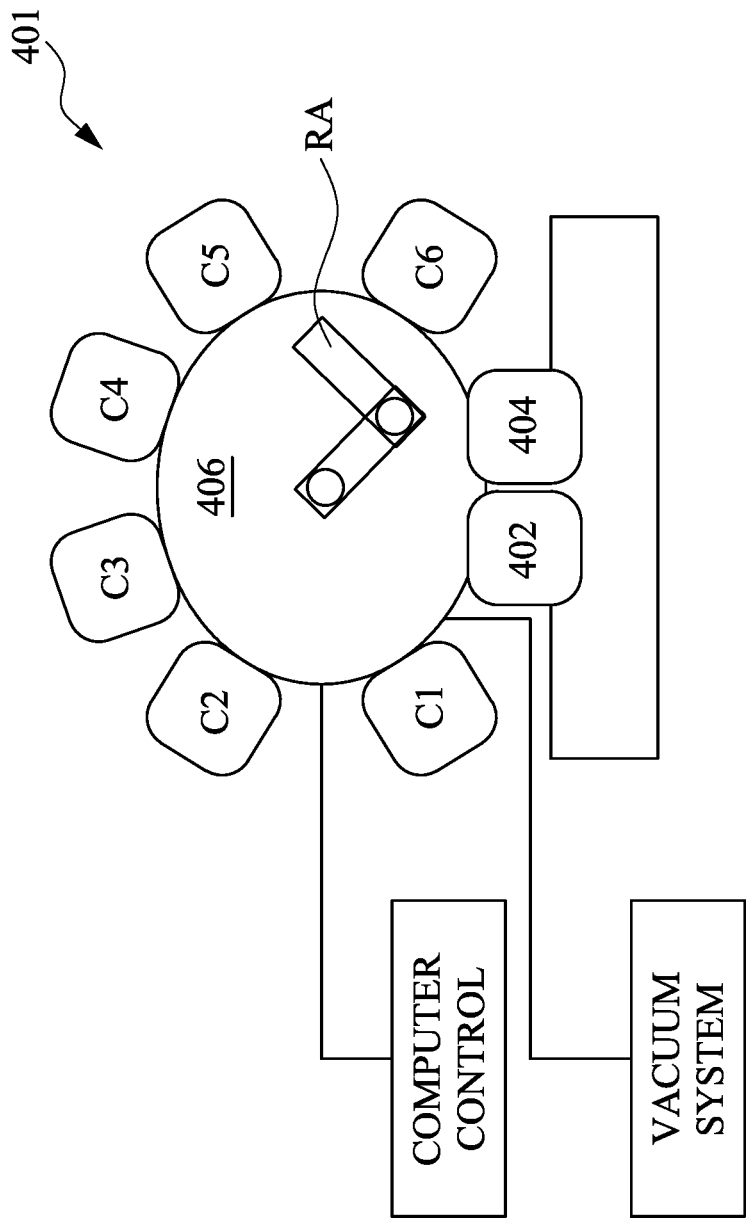
FIG. 6 is a schematic top-view diagram of an exemplary multi-chamber processing system in accordance with some embodiments.
Figure 7A:
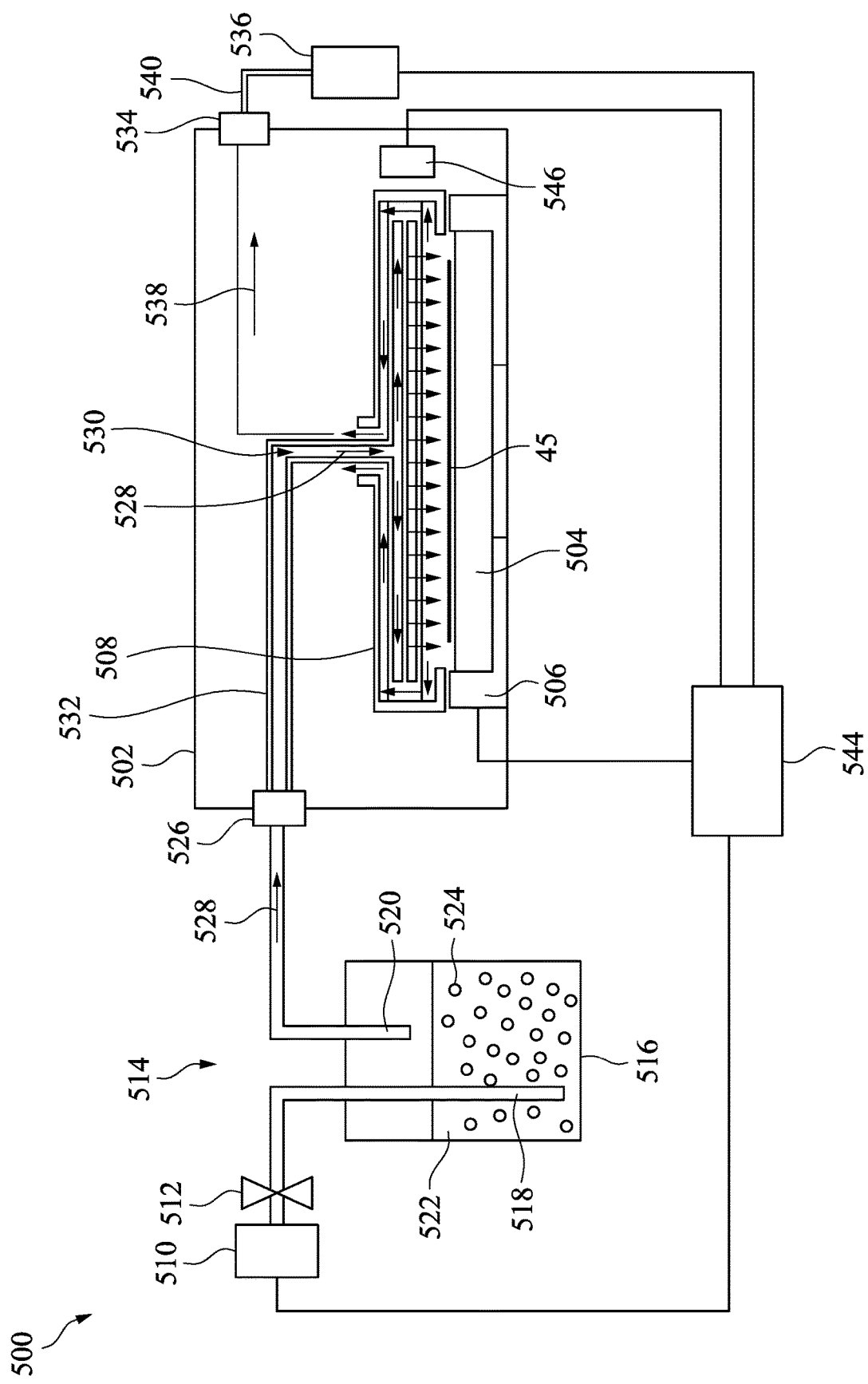
FIG. 7A is a manufacturing tool according to some embodiments.

In some embodiments, the organic treatment S102 using the organic compound such as benzene, the derivatives of benzene, or a combination thereof, is performed by a bubbler type apparatus since the benzene and its derivatives are highly volatile. Therefore, the organic treatment S102 can be performed at a room temperature without heating the photoresist layer 60. FIG. 6 is a schematic top-view diagram of an exemplary multi-chamber processing system in accordance with some embodiments. FIG. 7A is a manufacturing tool according to some embodiments. Reference is made to FIG. 6. In some embodiments, a system 401 illustrated is a multi-chamber processing system and may be equivalently referred to as a "cluster tool." The system 401 may generally include load lock chambers 402, 404, a substrate handling chamber 406, and a plurality of processing chambers C1-C6. In various embodiments, the system 401 may have more or less processing chambers. In some embodiments, the load lock chambers 402 and 404 provide for the transfer of wafers into and out of the system 401 using a system controller such as a computer control. In various embodiments, the system 401 is under vacuum such as using a vacuum system, and the load lock chambers 402 and 404 may "pump down" the wafers introduced into the system 401 (e.g., by way of a mechanical pump and/or a turbomolecular pump). In some embodiments, the load lock chambers 402 and 404 may be adapted to receive a single substrate or a plurality of substrates (e.g., loaded into a cassette). By way of example, the load lock chambers 402 and 404 may be separated from the substrate handling chamber 406 by way of a gate valve, allowing the substrate handling chamber 406 to remain under vacuum when one or both of the load lock chambers 402 and 404 are vented.

In some embodiments, the substrate handling chamber 406 is equipped with an automated robotic arm RA that may move smoothly along any of a horizontal, vertical, and/or rotational axis so as to transfer wafers between the load lock chambers 402, 404 and any of the substrate processing chambers C1-C6. Some of the processing chambers C1-C6 are configured to perform the organic treatment S102 (see FIG. 5). For example, some of the processing chambers C1-C6 may include a manufacturing tool 500 as shown in FIG. 7A. In some embodiments, after the exposure process S100, the semiconductor device 45 is transferred to the manufacturing tool 500 using the automated robotic arm RA.

Reference is made to FIG. 7A. In some embodiments, the manufacturing tool 500 includes a chamber 502, such as an organic treatment chamber. A wafer chuck 504 is disposed inside the chamber 502 to support the semiconductor device 45 during the organic treatment S102. The wafer chuck 504 may have a diameter that is suitable to hold the semiconductor device 45. For example, the wafer chuck 504 has a diameter greater than a diameter of the substrate 48 to stably hold the semiconductor device 45. A pedestal 506 is configured to hold the wafer chuck 504. The pedestal 506 can raise and lower the semiconductor device 45. A gas showerhead 508 is disposed over the wafer chuck 504 in some embodiments. The gas showerhead 508 is used as a manifold.

In some embodiments, the manufacturing tool 500 includes a gas source 510 and a gas valve 512 for controlling a flow of gas from the gas source 510 into a bubbler type apparatus such as a bubbler 514. The bubbler 514 includes a container 516 for accommodating a precursor 522, a first pipe 518 and a second pipe 520. The precursor 522 is a liquid stored in the container 516, and due to a high volatility of the precursor 522, the precursor 522 can be converted to its vapor form using a carrier gas bubbled into the container 516 through the first pipe 518. Bubbles 524 are produced in the precursor 522 by the carrier gas. The carrier gas flows from the gas source 510 and can be inert gas or nitrogen gas. The first pipe 518 is at a bottom of the container 516. A mixture of the carrier gas and the precursor 522 at its vapor phase exits the bubbler 514 into an input gas port 526 of the chamber 502 via the second pipe 520 of the bubbler 514 which is at a top of the container 516.

As shown, a flow 528 of the mixture of the carrier gas and the precursor at its vapor phase is redirected by a gas distribution line 532, and is directed through a hole 530 of the gas showerhead 508. The flow 528 is then flowed over a surface of the semiconductor device 45. In some embodiments, the spent mixture may be exhausted from the chamber 502 via an output gas port 534 of the chamber 502 through an exhaust system 536 capable of achieving a low pressure in the chamber 502. In some embodiments, a throttle valve (not shown) is disposed in the exhaust system 536 and is used for maintaining a desired chamber pressure.

Figure 7D:
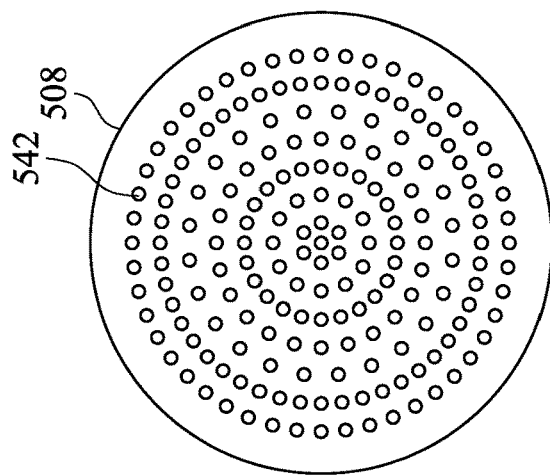
FIGS. 7B, 7C and 7D show embodiments of gas showerheads according to embodiments of the disclosure.
Figure 7C:
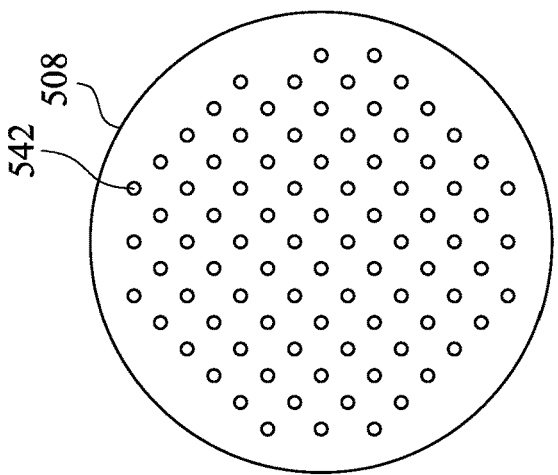
Figure 7B:
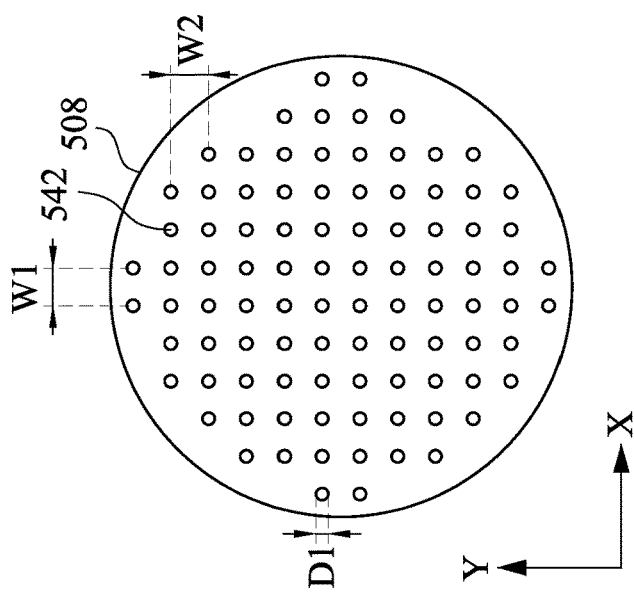

FIGS. 7B, 7C and 7D show embodiments of gas showerheads according to embodiments of the disclosure. In some embodiments, the gas showerhead 508 includes a plurality of openings 542 through which the gas flows, as shown in FIG. 7B. In some embodiments, the plurality of openings 542 is arranged in a row and column arrangement. In some embodiments, the plurality of openings 542 has a pitch W1, W2 along the X-direction and the Y-direction. In some embodiments, the pitch W1 and the pitch W2 are the same. In some other embodiments, the pitch W1 and the pitch W2 are different from each other. The arrangement of the openings 542 may be other patterns. For example, in FIG. 7C, the openings 542 may be arranged in alternating lines that are staggered relative to adjacent lines. In some other embodiment, the openings are arranged in concentric circles surrounding a central opening, as shown in FIG. 7D. The patterns of openings 542 are not limited to the embodiments shown herein. In other embodiments, other patterns, such as a spiral pattern, random pattern, are within the scope of this disclosure.

Referring back to FIG. 7A, in some embodiments, a controller 544 is configured to control a flow rate of the carrier gas from the gas source 510, and thus controls a flow rate of the flow 528 to the gas showerhead 508. In some embodiments, the controller 544 controls a mechanism 546 for raising and lowering the gas showerhead 508. In some embodiments, the controller 544 can control the exhaust system 536 for maintaining the desired chamber pressure.

Figure 8A:
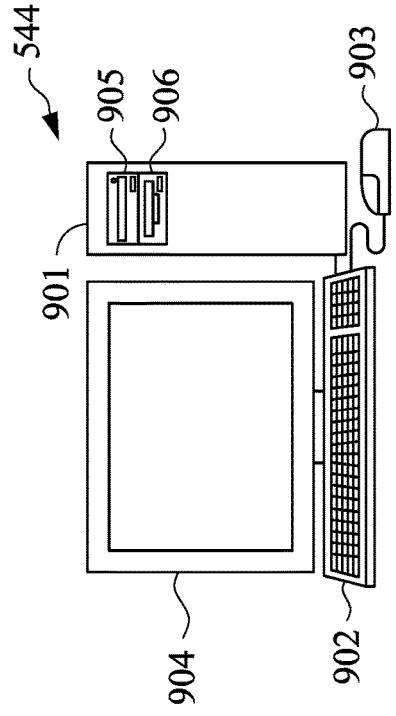
FIG. 8A is a schematic view of a controller that executes the organic treatment data generating process according to one or more embodiments.
Figure 8B:
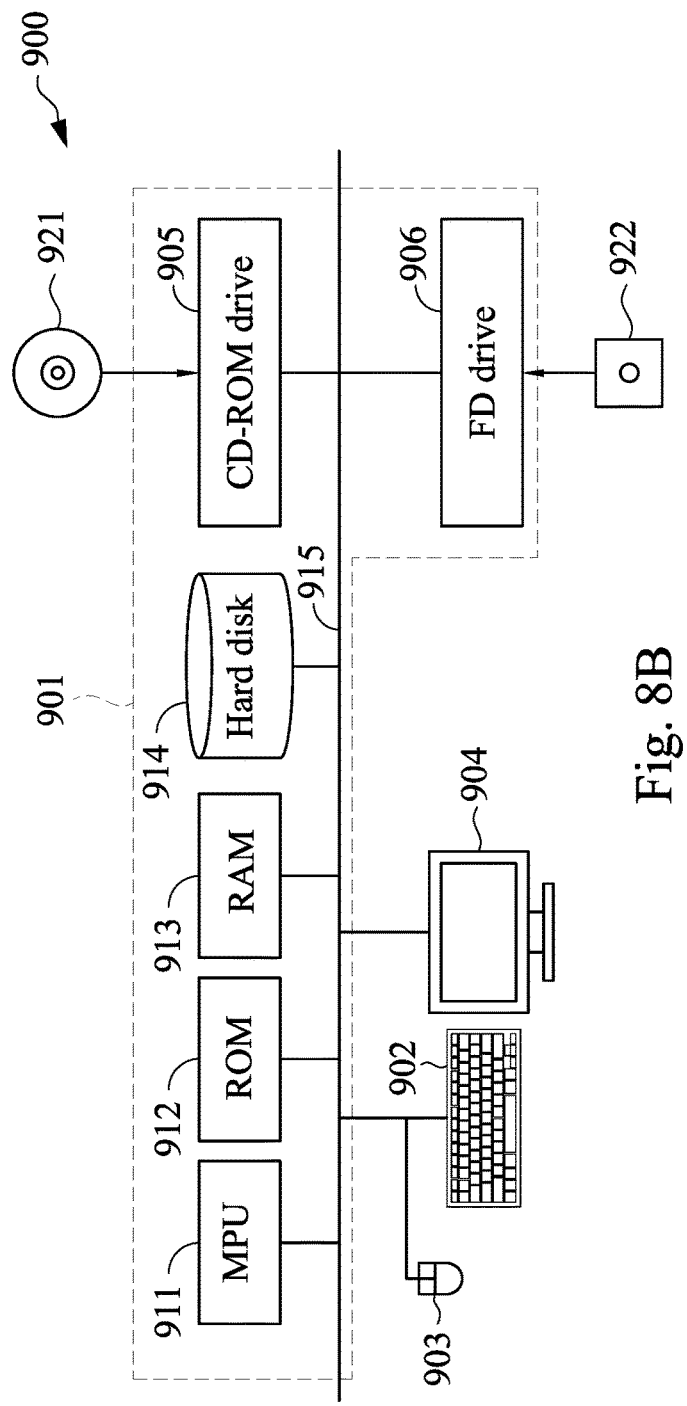
FIG. 8B is a diagram showing an internal configuration of the controller.

FIGS. 8A and 8B show an organic treatment data generating apparatus according to an embodiment of the present disclosure. FIG. 8A is a schematic view of a controller that executes the organic treatment data generating process according to one or more embodiments as described above. All of or a part of the process, method and/or operations of the foregoing embodiments can be realized using computer hardware and computer programs executed thereon. In FIG. 8A, the controller 544 is a computer system provided with a computer 901 including an optical disk read only memory (e.g., CD-ROM or DVD-ROM) drive 905 and a magnetic disk drive 906, a keyboard 902, a mouse 903, and a monitor 904.

FIG. 8B is a diagram showing an internal configuration of the controller 544. In FIG. 8B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the controller 544 to execute the functions of the organic treatment data generating apparatus in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the organic treatment data generating apparatus in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs in some embodiments. Furthermore, a computer that executes the programs may be a single computer or may be multiple computers.

Further, the entirety of or a part of the programs to realize the functions of the organic treatment data generating apparatus is a part of another program used for the organic treatment fabrication processes in some embodiments. In addition, the entirety of or a part of the programs to realize the functions of the organic treatment data generating apparatus is realized by a ROM made of, for example, a semiconductor device in some embodiments.

Figure 9:
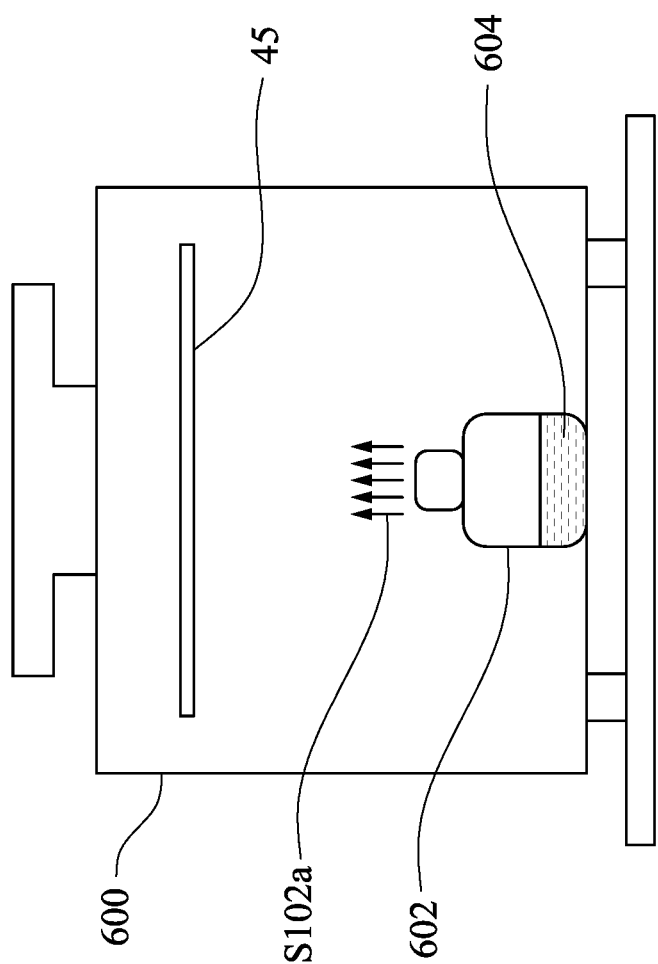
FIG. 9 is a diagrammatic fragmentary cross-sectional side view of a semiconductor device at various stages of fabrication in accordance with various aspects of the present disclosure.

FIG. 9 is a diagrammatic fragmentary cross-sectional side view of a semiconductor device at various stages of fabrication in accordance with various aspects of the present disclosure. In FIG. 9, a manufacturing tool 600 includes a front opening unified pod (FOUP) which is a container having a slideable and sealable door, and containing a cassette of a plurality of spaced wafers. The manufacturing tool 600 may include an access door for the automated robotic arm RA (see FIG. 6) into the manufacturing tool 600. The semiconductor device 45 is put into the manufacturing tool 600 and is disposed on a top side of the manufacturing tool 600. A container 602 is disposed on a bottom floor of the manufacturing tool 600. A precursor 604 is stored in the container 602. The precursor 604 is similar to the precursor 522 as discussed previously with regard to FIG. 7A in terms of composition, and can be converted to its vapor form easily due to its high volatility. In FIG. 9, the semiconductor device 45 is exposed to a closed and controlled environment of the manufacturing tool 600. The manufacturing tool 600 sufficiently includes a precursor vapor vaporized from the precursor 604 so that the semiconductor device 45 can be organic treated by the organic treatment S102a. In some embodiments, the semiconductor device is rested in the manufacturing tool 600 such that the organic treatment S102a is performed in a range from 0.5 hour to 2 hours, such as 1 hour.

Referring back to FIG. 5, after the photoresist layer 60 undergone the organic treatment S102, a post-exposure baking is performed to further assist the chemical reaction such as generating chemical difference between the exposed region and the unexposed region. These chemical differences cause differences in the solubility between the exposed region and the unexposed region.

Figure 10:
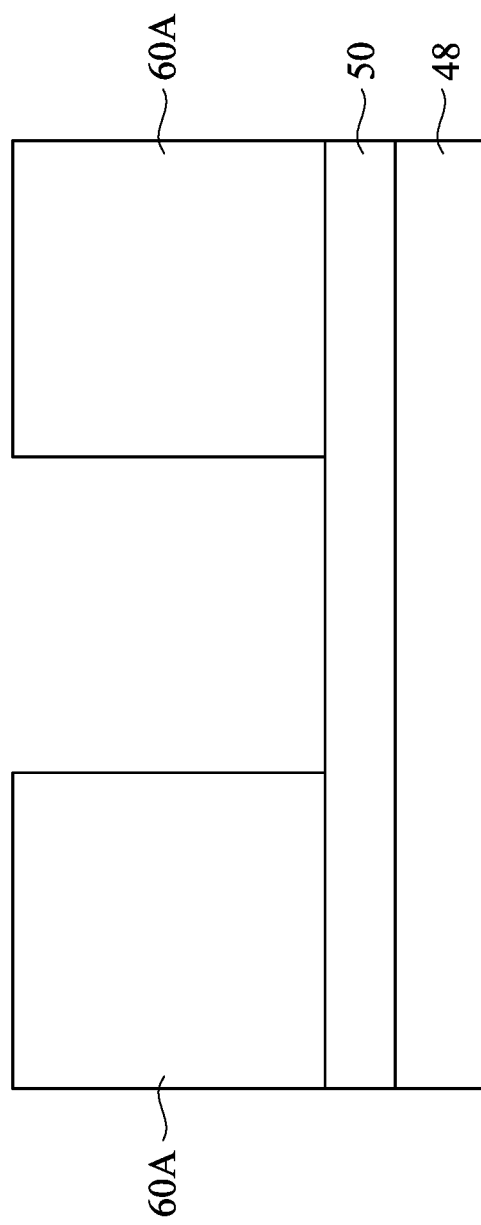
FIG. 10 is a diagrammatic fragmentary cross-sectional side view of a semiconductor device at various stages of fabrication in accordance with various aspects of the present disclosure.

Referring now to FIG. 10, the photoresist layer 60 is developed using a developer, forming patterned photoresists 60A separated by a recess. In some embodiments, the developer includes an organic solvent such as propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), 2-heptanone (MAK), or isobutyl propionate. In other embodiments, the developer is an aqueous solvent, such as a tetramethylammonium hydroxide (TMAH) solution.

In some embodiments, the developer is applied to the photoresist layer 60 using a spin-on process. In the spin-on process, the developer is applied to the photoresist layer 60 from above the photoresist layer 60 while the substrate 48 is rotated.

While the spin-on process is one suitable method for developing the photoresist layer 60 after exposure, it is not intended to limit the embodiment. Rather, any suitable development operations, including dip processes, puddle processes, and spray-on methods, may alternatively be used. All such development operations are included within the scope of the embodiments.

Figure 11B:
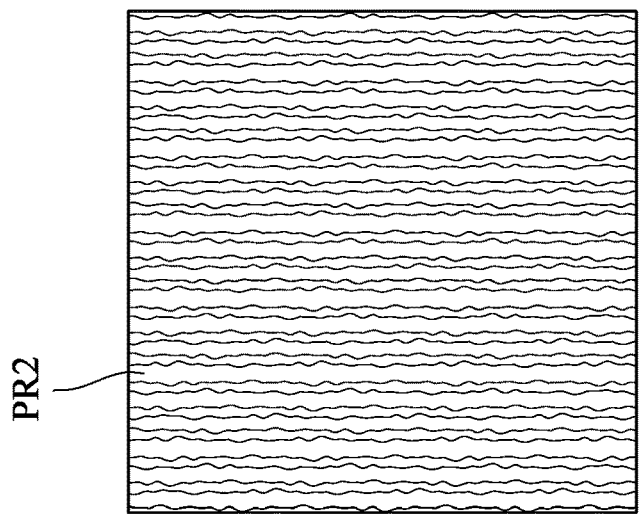
FIG. 11B is a comparative example in which patterned photoresists have a similar composition as the photoresist layer in FIG. 11A but without being treated with the organic treatment.
Figure 11A:
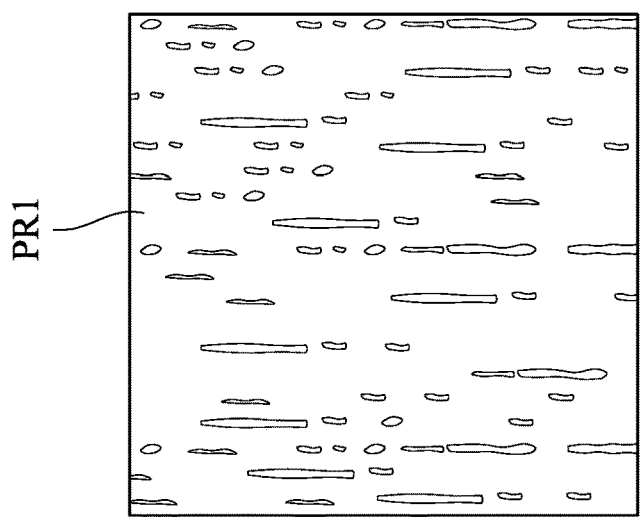
FIG. 11A illustrates a top view of a photoresist layer that may be observed using a scanning electron microscope (SEM) in accordance with some embodiments.

FIG. 11A illustrates a top view of a photoresist layer PR1 that may be observed using a scanning electron microscope (SEM) in accordance with some embodiments. In FIG. 11A, the photoresist layer PR1 is treated with the organic treatment S102 (see FIG. 5) using toluene, which is the derivative of benzene, and is not developed. FIG. 11B is a comparative example in which patterned photoresists PR2 have a similar composition as the photoresist layer PR1 in FIG. 11A but without being treated with the organic treatment S102. The patterned photoresists PR2 are developed and have a pitch of about 15 nm. FIG. 11C is a table that shows experimental data comparing after development inspection (ADI) trench critical dimension (CD) of the photoresist layer PR1 and the patterned photoresist PR2 in accordance with some embodiments. Reference is made to FIGS. 11A-11C. Although not being developed, an observable contrast of the photoresist layer PR1 is shown in FIG. 11A. For example, an ADI trench CD of the photoresist layer PR1 has a reduced amount of 1.3 nm to 1.7 nm, such as 1.5 nm compared to the ADI trench CD of the patterned photoresists PR2.

Figure 12B:
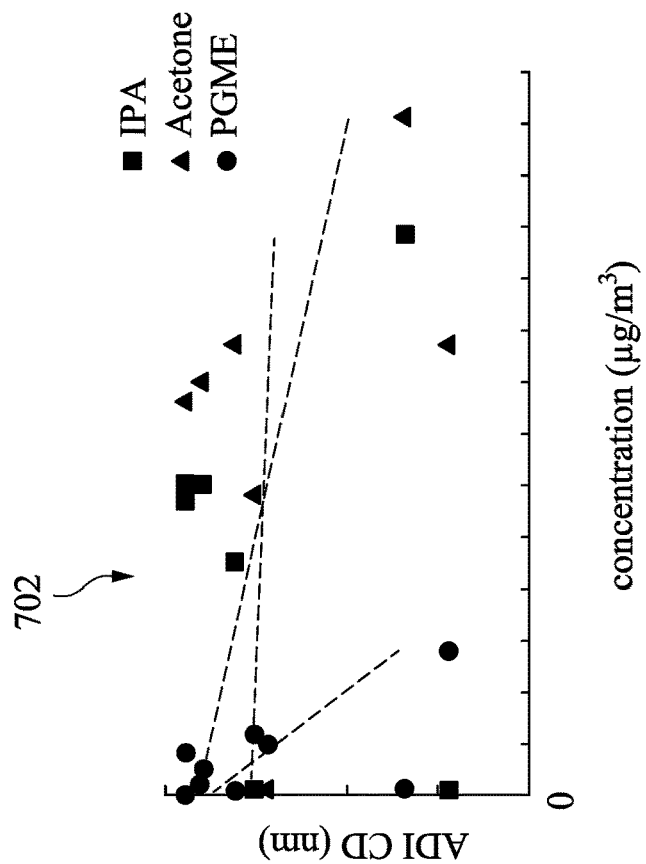
FIG. 12B is a graph showing the ADI CD versus concentrations of isopropyl alcohol (IPA), acetone, and propylene glycol monomethyl ether (PGME).
Figure 12A:
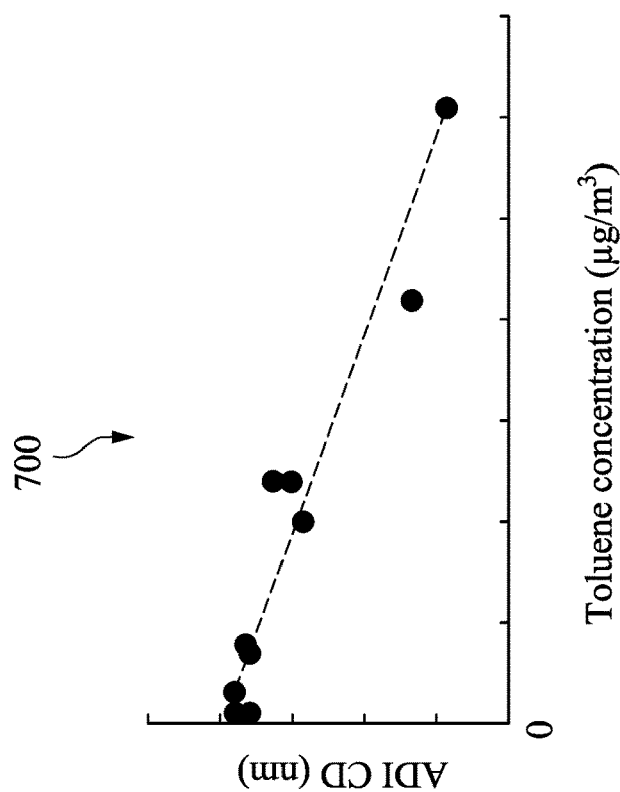
FIG. 12A is a graph showing after development inspection (ADI) critical dimension (CD) versus a concentration of toluene used for the organic treatment in accordance with some embodiments.
Figure 13:
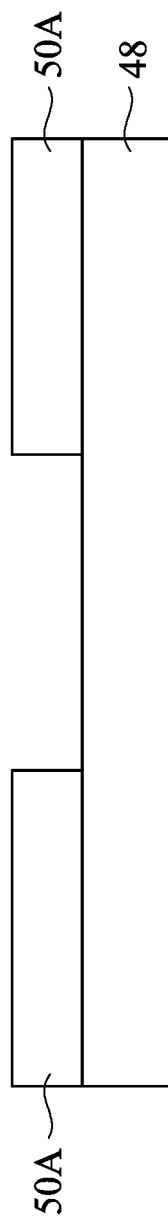
FIG. 13 is a diagrammatic fragmentary cross-sectional side view of a semiconductor device at various stages of fabrication in accordance with various aspects of the present disclosure.

FIG. 12A is a graph 700 showing after development inspection (ADI) critical dimension (CD) versus a concentration of toluene used for the organic treatment in accordance with some embodiments. Referring to FIG. 12A, as the concentration of the toluene increases, the ADI CD deceases. Each of data can be modeled as a regression line in the form of:

$$y = mx + b, \quad \text{Equation 1}$$

where x is the dependent variable (toluene concentration ($\mu g/m^3$)), y is the independent variable (ADI CD (nm)), m is the slope of the line, and b is the y-intercept.

The data are characterized by R-squared ($R^2$), where $R^2$ is a statistical measure of how close the data are to the fitted regression line y. It is also known as the coefficient of determination, or the coefficient of multiple determination for multiple regression. The definition of $R^2$ is the percentage of the response variable variation that is explained by the linear model y.

$R^2$ is between 0 and 100% where 0% indicates that the model explains none of the variability of the response data around its mean and 100% indicates that the model explains all the variability of the response data around its mean. In general, the higher the $R^2$, the better the model fits the data. In the example illustrated in FIG. 12A, the $R^2$ for regression line in the graph 700 is about 0.90 to 0.95, such as 0.93. That is to say, an almost linear correlation between the ADI CD and the concentration of the toluene is observed.

FIG. 12B is a graph 702 showing the ADI CD versus concentrations of isopropyl alcohol (IPA), acetone, and propylene glycol monomethyl ether (PGME). In FIG. 12B, the coefficient of determination ($R^2$) for regression line of the IPA is about 0.01±0.005, the coefficient of determination ($R^2$) for regression line of the acetone is 0.33±0.001, and the coefficient of determination ($R^2$) for regression line of the PGME is 0.36±0.001, which all of them are much less than the coefficient of determination ($R^2$) for regression line in the graph 700. The correlations between the ADI CD and the concentration of the IPA, the concentration of the acetone, and the concentration of the PGME are not linear.

Using the patterned photoresists 60A (see FIG. 10) as a mask, additional fabrication processes such as etching or implantation may be performed. For example, referring to FIG. 13, the material layer 50 is etched into patterned material layers 50A separated by a recess. Thereafter, the patterned photoresists 60A may be removed by a photoresist removal process known in the art, such as a stripping or an ashing process.

Although the discussions above use EUV lithography as an example, it is understood that the various aspects of the photoresist layer may apply to other types of lithography as well, such as an e-beam lithography.

Figure 14:
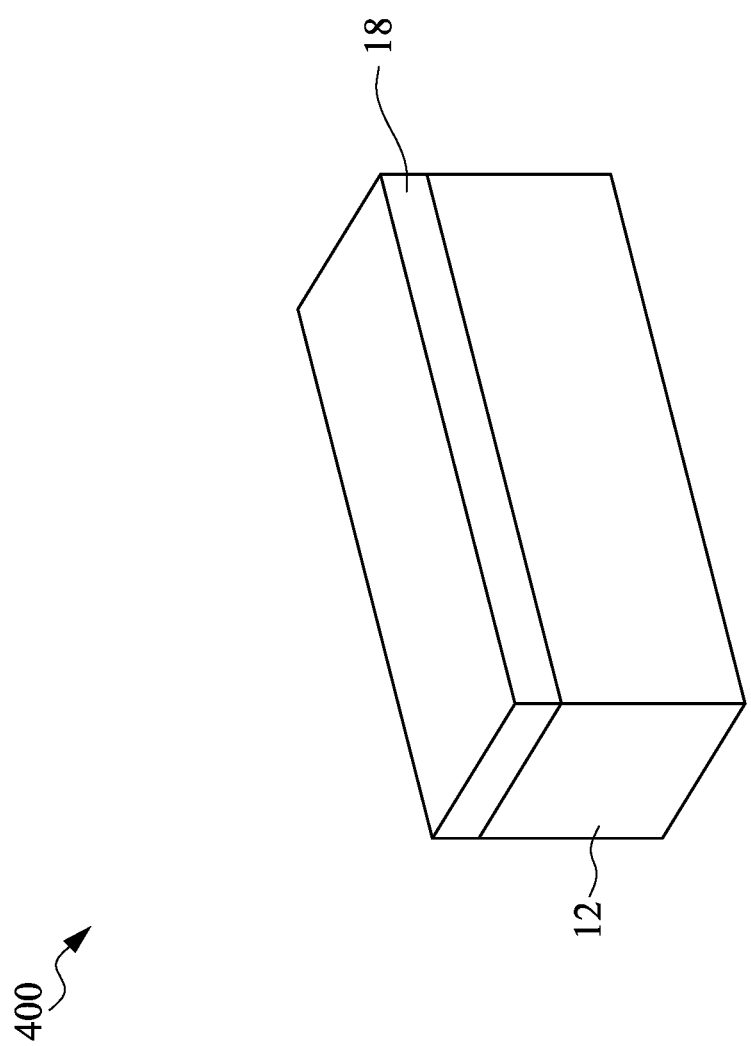
FIGS. 14, 15, 16, 17, 18, 19, 20, and 21A illustrate perspective views of additional fabrication processes in the formation of a semiconductor device on a substrate in accordance with some embodiments of the present disclosure.

FIGS. 14, 15, 16, 17, 18, 19, 20 and 21A illustrate perspective views of additional fabrication processes in the formation of a semiconductor device 400 in accordance with some embodiments of the present disclosure. FIGS. 21B, 22, 23 and 24 illustrate cross-sectional views of additional fabrication processes in the formation of a semiconductor device 400 in accordance with some embodiments of the present disclosure. Reference is made to FIG. 14. FIG. 14 illustrates a perspective view of an initial structure. The initial structure includes a substrate 12, which is a part of a semiconductor wafer. The substrate 12 is similar to the substrate 48 as discussed previously with regard to FIG. 3 in terms of composition, and its detailed description will be omitted herein. A photoresist layer 18 may be formed on the substrate 12 using a spin coating method. The photoresist layer 18 is similar to the photoresist layer 60 as discussed previously with regard to FIG. 3 in terms of composition and formation method, and its detailed description will be omitted herein. In some embodiments, the photoresist layer 18 is in contact with the substrate 12.

Figure 15:
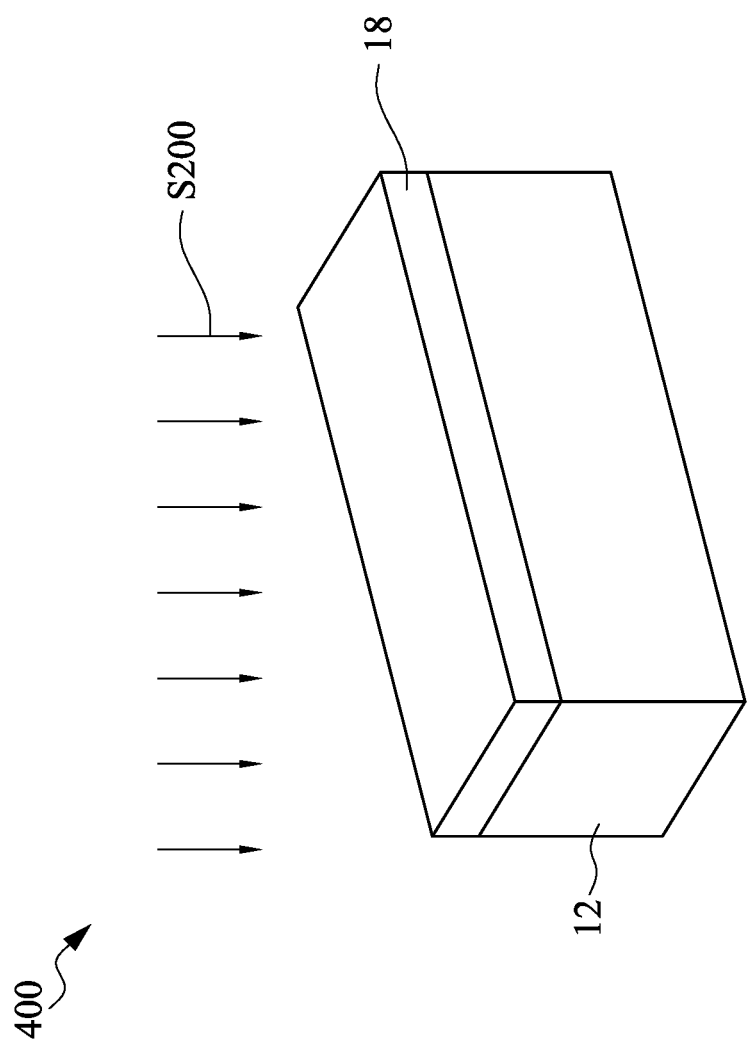

Referring to FIG. 15, an exposure process S200 is performed to expose the photoresist layer 18 to an EUV radiation, as discussed previously with regard to FIG. 4.

Figure 16:
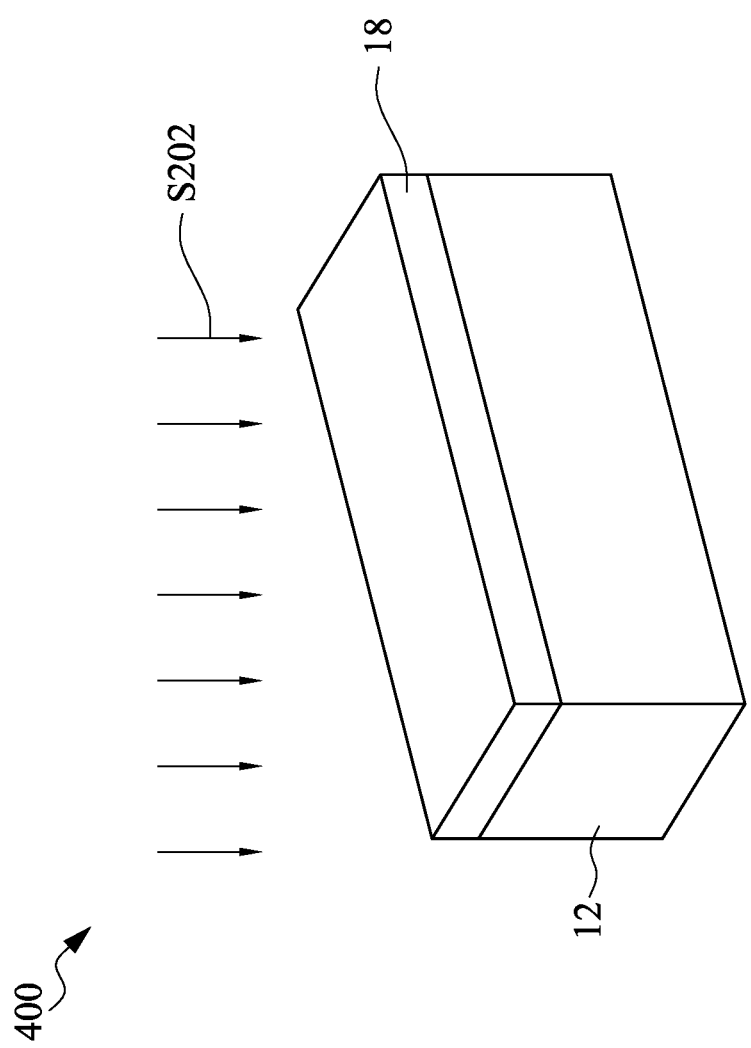

Referring to FIG. 16, after the exposure process S200, an organic treatment S202 is performed to the photoresist layer 18 to enhance the homolytic cleavage of the tin-carbon bonds such that more tin-centered radicals are produced, resulting in enhanced crosslinking reaction of the photoresist layer 18, as discussed previously with regard to FIG. 5. Therefore, the dosage required for the EUV exposure can be reduced and cost of operation (CoO) can be reduced under use of the metallic resist.

Figure 17:
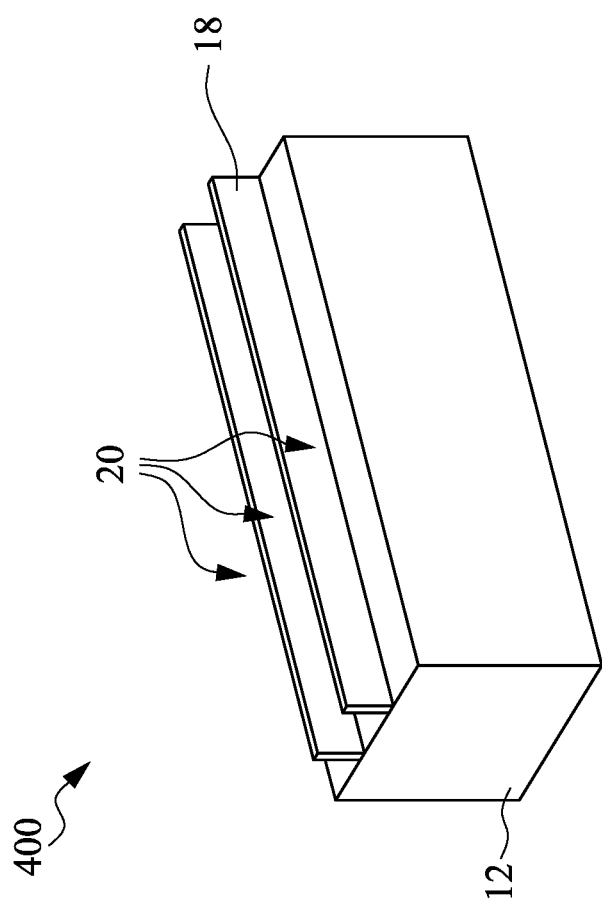
Figure 18:
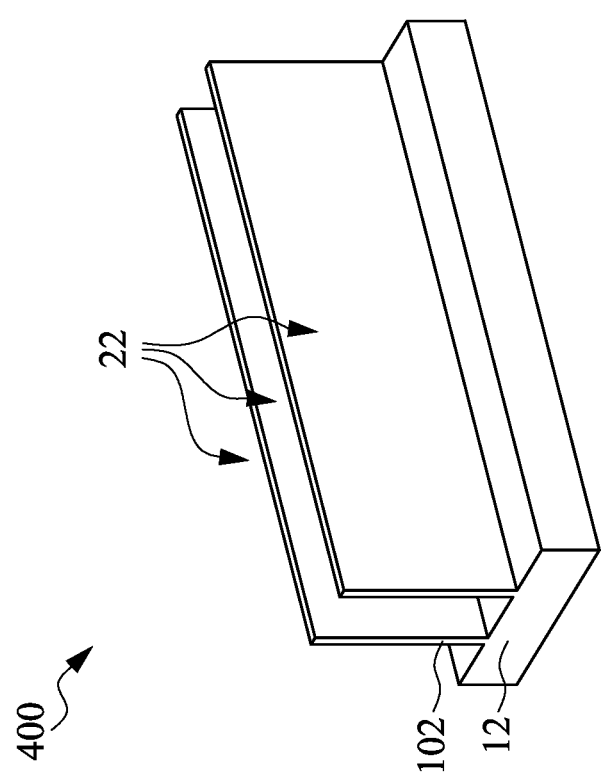

Referring to FIG. 17, the photoresist layer 18 is patterned, forming openings 20 in the photoresist layer 18. The exposed substrate 12 is then etched, forming trenches 22, as shown in FIG. 18. Portions of the substrate 12 between neighboring trenches 22 form semiconductor strips 102. The trenches 22 may be strips (when viewed from a top of the substrate 12) that are parallel to each other, and closely located from each other. After etching the substrate 12, the photoresist layer 18 is removed. Next, a cleaning step may be performed to remove native oxide formed on surfaces of the substrate 12. The cleaning may be performed using diluted hydrofluoric (HF) acid, for example.

Figure 19:
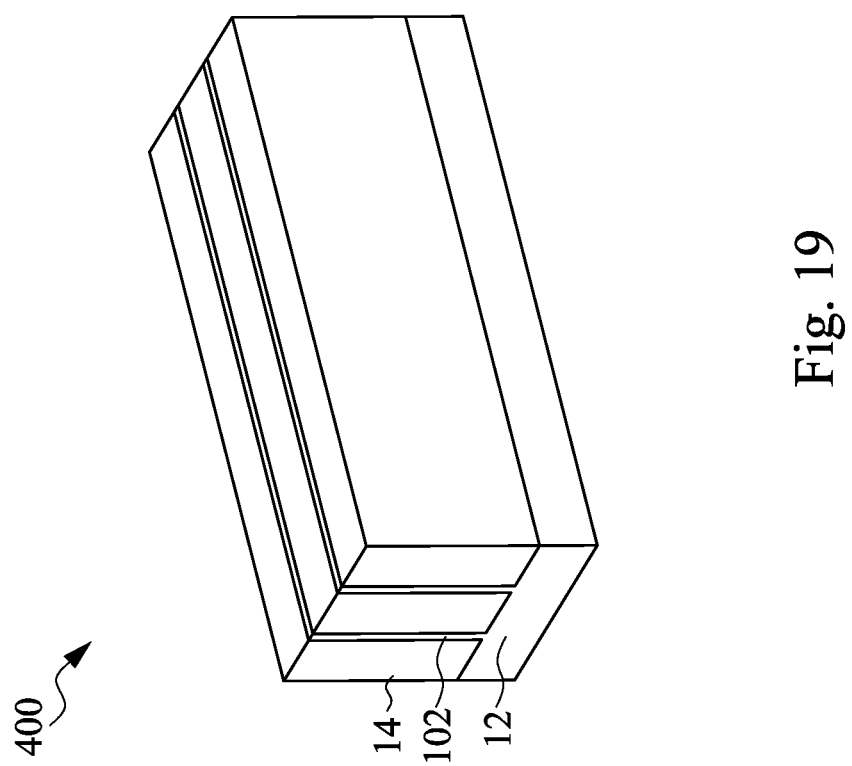

Next, the trenches 22 are filled with a dielectric material using a spin-on method, flowable chemical vapor deposition (FCVD), or the like. In some embodiments, a dielectric liner (not shown) is formed in the trenches 22 prior to forming the dielectric material and may be a conformal layer formed using a deposition technique such as atomic layer deposition (ALD) or the like. A planarization such as chemical mechanical polish (CMP) is then performed to the dielectric material, as shown in FIG. 19, and hence shallow trench isolation (STI) region 14 is formed.

Figure 20:
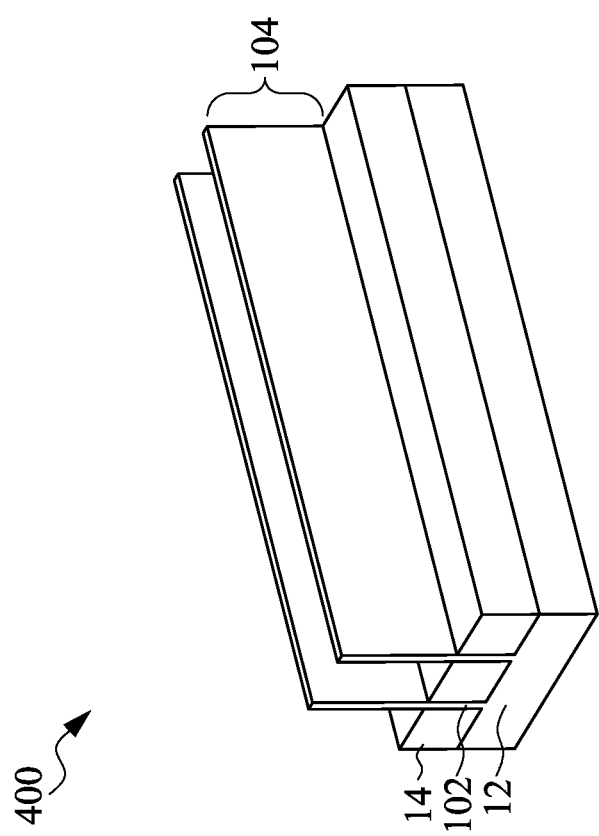

Referring to FIG. 20, the STI region 14 is recessed, so that top portions of semiconductor strips 102 protrude higher than top surfaces of the neighboring STI region 14 to form protruding fins 104. The etching may be performed using a dry etching process or a wet etching process.

Figure 21A:
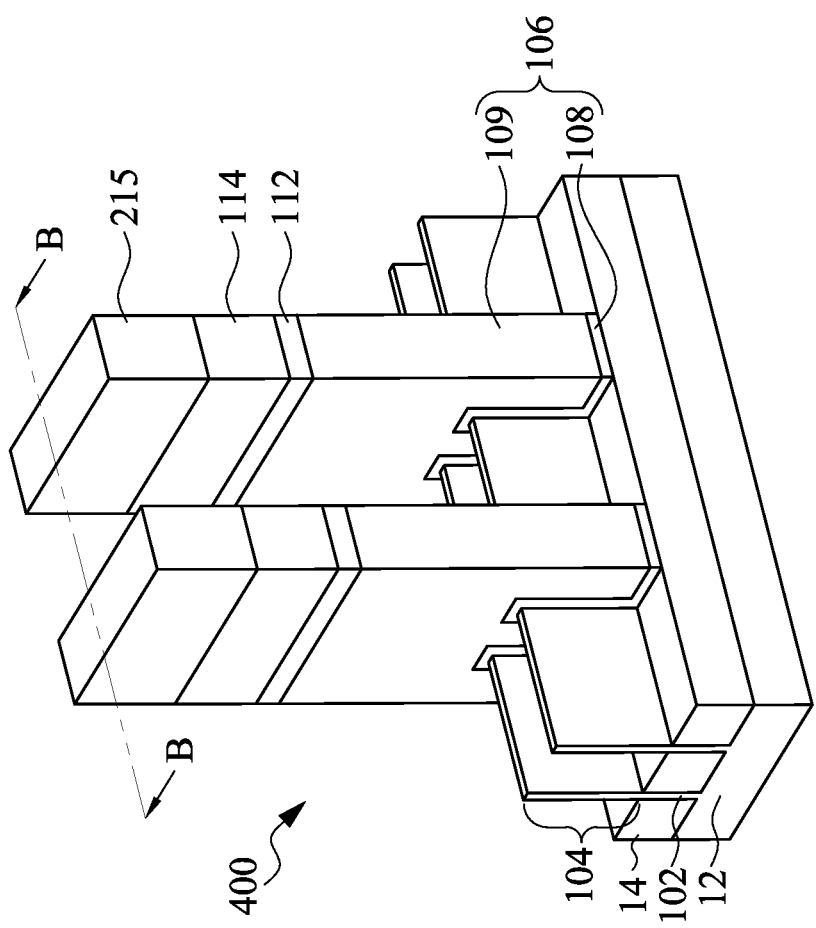

Referring to FIGS. 21A and 21B, dummy gate structures 106 are formed on the top surfaces and the sidewalls of fins 104. FIG. 21B illustrates a cross-sectional view obtained from a vertical plane containing line B-B in FIG. 21A. Formation of the dummy gate structures 106 includes depositing in sequence a blankly formed gate dielectric layer and a blankly formed dummy gate electrode layer across the fins 104, followed by patterning the blanket formed gate dielectric layer and the blankly formed dummy gate electrode layer. As a result of the patterning, the dummy gate structure 106 includes a dummy gate dielectric layer 108 and a dummy gate electrode 109 over the dummy gate dielectric layer 108. The dummy gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 109 can be any acceptable electrode layer, such as comprising polysilicon, metal, the like, or a combination thereof. The dummy gate electrode layer can be deposited by any acceptable deposition process, such as CVD, plasma enhanced CVD (PECVD), or the like. Each of dummy gate structures 106 crosses over a single one or a plurality of fins 104. The dummy gate structures 106 may have lengthwise directions perpendicular to the lengthwise directions of the respective fins 104.

The blankly formed dummy gate electrode layer and the blankly formed gate dielectric layer may be patterned using a tri-layer structure. Bottom masks 112, top masks 114 and photoresist layers 215 are formed over the blankly formed dummy gate electrode layer in sequence. The photoresist layers 215 may be similar to the patterned photoresist 60A as discussed previously with regard to FIGS. 3-6 and 10 in terms of composition and formation methods, and its detailed description will be omitted herein.

In an alternative embodiment, the bottom masks 112 and the top masks 114 are made of one or more layers of $SiO_2$, SiCN, SiON, $Al_2O_3$, SiN, or other suitable materials. In certain embodiments, the bottom masks 112 include silicon nitride, and the top masks 114 include silicon oxide. The photoresist layers 215 may be removed by a photoresist removal process known in the art, such as a stripping or an ashing process.

Figure 22:
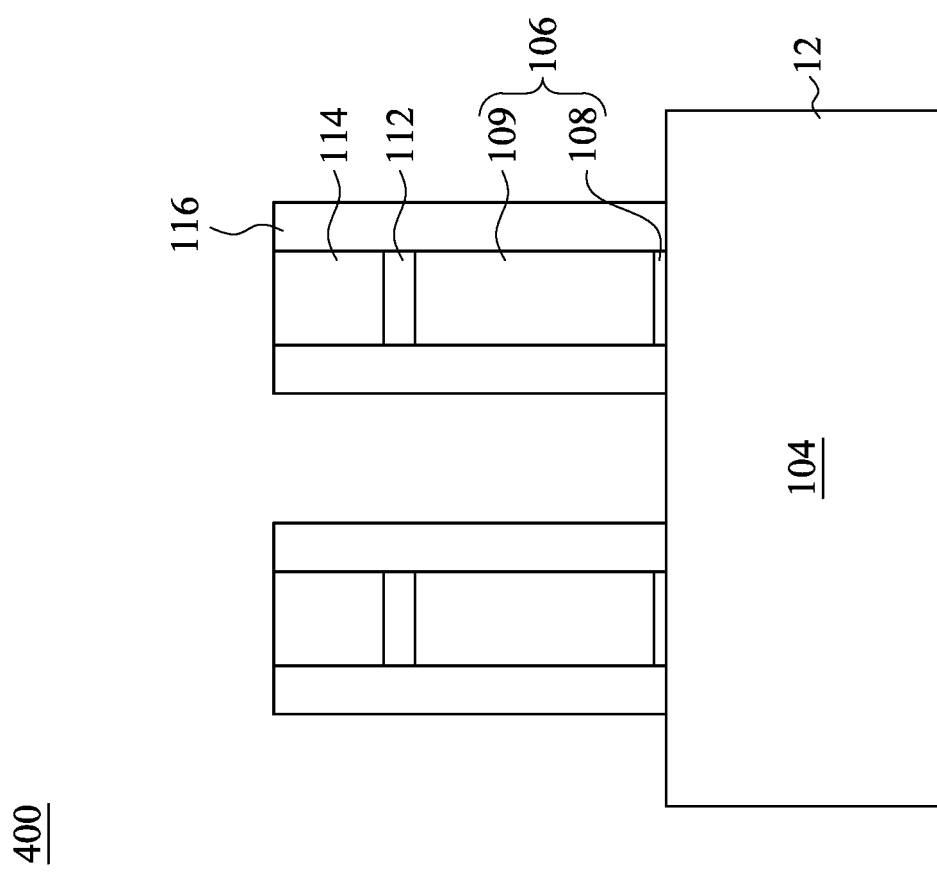

Next, as illustrated in FIG. 22, gate spacers 116 are formed on sidewalls of the dummy gate structures 106. In some embodiments of the gate spacer formation step, a spacer material layer is deposited on the substrate 12. The spacer material layer may be a conformal layer that is subsequently etched back to form gate spacers 116. The spacer material layer is made of a low-k dielectric material. The low-k dielectric material has a dielectric constant (k value) of lower than about 3.5. Suitable materials for the low-k dielectric material may include silicon oxide, silicon nitride, silicon oxynitride, or the like. By way of example and not limitation, the spacer material layer may be formed using processes such as, CVD process, a subatmospheric CVD (SACVD) process, a flowable CVD process, an ALD process, a physical vapor deposition (PVD) process, or other suitable process. An anisotropic etching process is then performed on the deposited spacer material layer to expose portions of the fins 104 not covered by the dummy gate structures 106 (e.g., in source/drain regions of the fins 104). Portions of the spacer material layer directly above the dummy gate structures 106 may be completely removed by this anisotropic etching process. Portions of the spacer material layer on sidewalls of the dummy gate structures 106 may remain, forming gate spacers, which are denoted as the gate spacers 116, for the sake of simplicity. In some embodiments, the gate spacers 116 may be used to offset subsequently formed doped regions, such as source/drain regions. The gate spacers 116 may further be used for designing or modifying the source/drain region profile.

Figure 23:
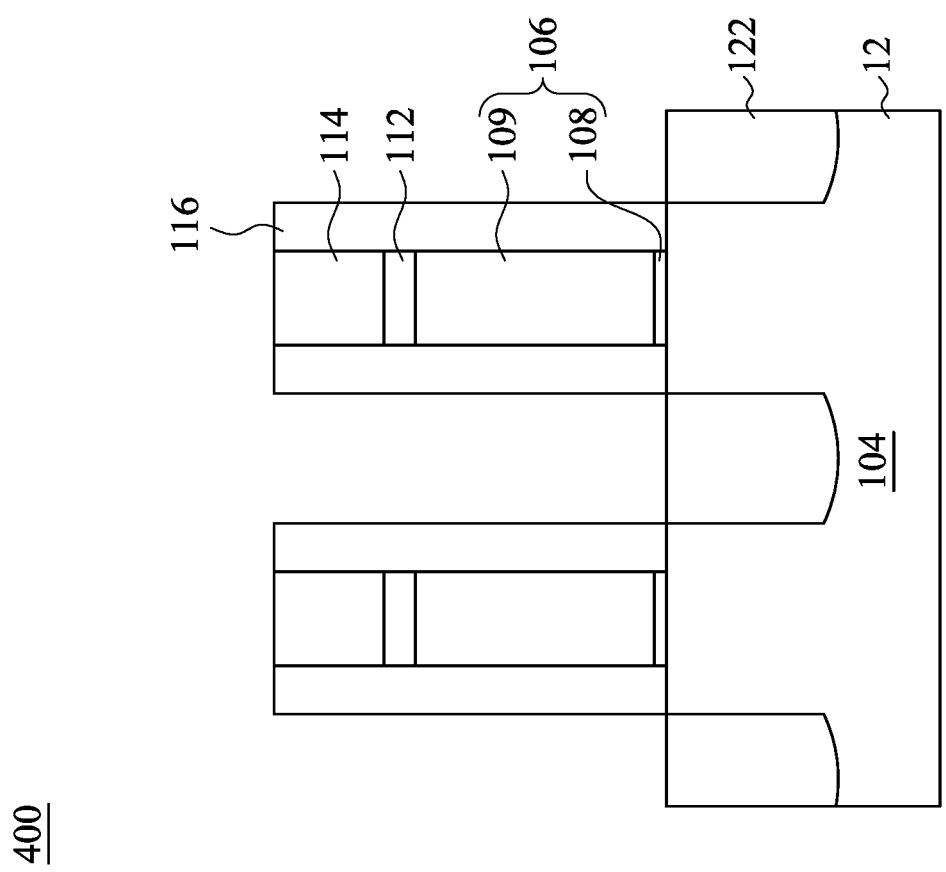

In FIG. 23, after formation of the gate spacers 116 is completed, source/drain epitaxial structures 122 are formed on source/drain regions of the protruding fins 104 that are not covered by the dummy gate structures 106 and the gate spacers 116. In some embodiments, formation of the source/drain epitaxial structures 122 includes recessing source/drain regions of the fin 104, followed by epitaxially growing semiconductor materials in the recessed source/drain regions of the fin 104. The source/drain epitaxial structures 122 are on opposite sides of the dummy gate structure 106.

The source/drain regions of the fins 104 can be recessed using suitable selective etching processing that attacks the fins 104, but hardly attacks the gate spacers 116 and the top masks 114 of the dummy gate structures 106. For example, recessing the fins 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the protruding fins 104 at a faster etch rate than it etches the gate spacers 116 and the top masks 114 of the dummy gate structures 106. In some other embodiments, recessing the protruding fins 104 may be performed by a wet chemical etch which etches the fins 104 at a faster etch rate than it etches the gate spacers 116 and the top masks 114 of the dummy gate structures 106. In some other embodiments, recessing the protruding fins 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the protruding fins 104. During the epitaxial growth process, the gate spacers 116 limit the one or more epitaxial materials to source/drain regions in the fin 104. In some embodiments, the lattice constants of the source/drain epitaxial structures 122 are different from the lattice constant of the fins 104, so that the channel region in the fin 104 and between the source/drain epitaxial structures 122 can be strained or stressed by the source/drain epitaxial structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes.

The epitaxy process may use gaseous and/or liquid precursors, which interact with the composition of the fins 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including p-type dopants, such as boron or $BF_2$, n-type dopants, such as phosphorus or arsenic, and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 24:
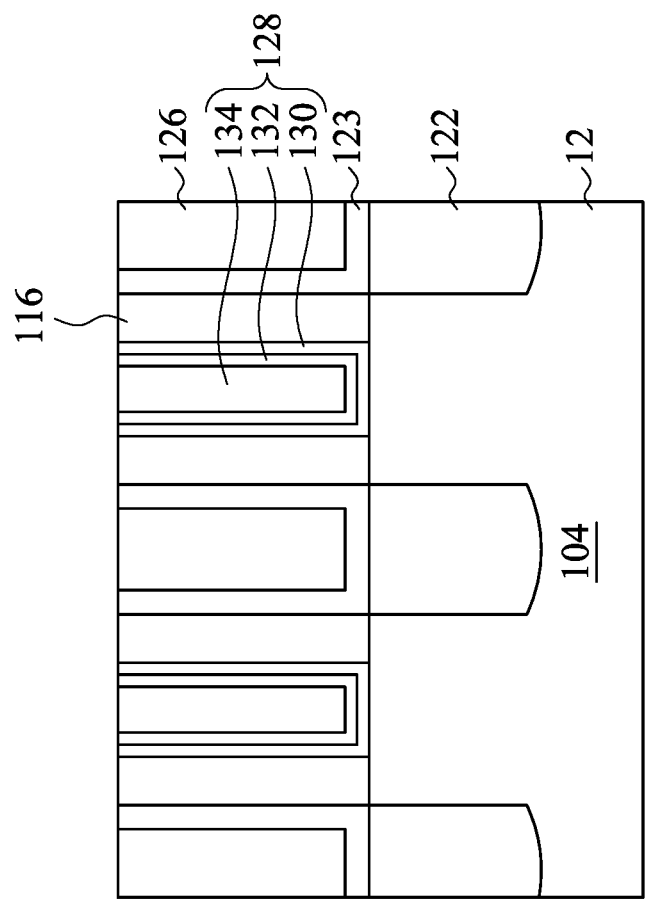

Next, in FIG. 24, a contact etch stop layer (CESL) 123 and an interlayer dielectric (ILD) layer 126 are formed on the substrate 12 in sequence. In some examples, the CESL 123 includes a silicon nitride layer, silicon oxide layer, a silicon oxynitride layer, and/or other suitable materials having a different etch selectivity than the ILD layer 126. The CESL 123 may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 123. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126 and the CESL 123. For example, a planarization process includes a chemical mechanical planarization (CMP) process which removes portions of the ILD layer 126 and the CESL 123 overlying the dummy gate structures 106. In some embodiments, the CMP process also removes bottom masks 112 and top masks 114 (as shown in FIG. 23) and exposes the dummy gate electrodes 109.

An etching process is performed to remove the dummy gate electrode 109 and the dummy gate dielectric layer 108, resulting in gate trenches between corresponding gate spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., gate spacers 116 and/or the ILD layer 126).

Thereafter, replacement gate structures 128 are respectively formed in the gate trenches. The gate structures 128 may be the final gates of FinFETs. In FinFETs, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. The final gate structures each may be a high-k/metal gate (HKMG) stack, however other compositions are possible. In some embodiments, each of the gate structures 128 forms the gate associated with the three-sides of the channel region provided by the fin 104. Stated another way, each of the gate structures 128 wraps around the fin 104 on three sides. In various embodiments, the high-k/metal gate structure 128 includes a gate dielectric layer 130 lining the gate trench, a work function metal layer 132 formed over the gate dielectric layer 130, and a fill metal 134 formed over the work function metal layer 132 and filling a remainder of gate trenches. The gate dielectric layer 130 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 132 and/or the fill metal 134 used within high-k/metal gate structures 128 may include a metal, metal alloy, or metal silicide. Formation of the high-k/metal gate structures 128 may include multiple deposition processes to form various gate materials, one or more liner layers, and one or more CMP processes to remove excessive gate materials.

In some embodiments, the interfacial layer of the gate dielectric layer 130 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 130 may include hafnium oxide ($HfO_2$). Alternatively, the gate dielectric layer 130 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 132 may include work function metals to provide a suitable work function for the high-k/metal gate structures 128. For an n-type FinFET, the work function metal layer 132 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 132 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 134 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In some embodiments, the semiconductor device 400 includes other layers or features not specifically illustrated. In some embodiments, back end of line (BEOL) processes are performed on the semiconductor device 400. In some embodiments, the semiconductor device 400 is formed by a non-replacement metal gate process or a gate-first process.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the crosslink reaction of the photoresist is enhanced by treating the photoresist with the organic compound. Another advantage is that the energy dosage for the EUV exposure is reduced, and thus cost of operation (CoO) is reduced.

In some embodiments, a method of manufacturing a semiconductor device includes the following steps. A photoresist layer is formed over a material layer on a substrate. The photoresist layer is exposed. An organic treatment to the photoresist layer is performed. After performing the organic treatment, the photoresist layer is developed. The material layer is etched using the photoresist layer as a mask. In some embodiments, the organic treatment is performed without heating the photoresist layer. In some embodiments, the organic treatment is performed using benzene, derivatives of benzene, or a combination thereof. In some embodiments, photoresist layer comprises a metallic resist having a metal-carbon bond, and the organic treatment is performed such that the metal-carbon bond has a homolytic cleavage. In some embodiments, performing the organic treatment comprises the following steps. The substrate is transferred to a chamber connected to a bubbler, wherein the bubbler comprises a precursor. A carrier gas is introduced into the bubbler such that a flow of a mixture of the carrier gas and the precursor is directed into the chamber. In some embodiments, performing the organic treatment further includes directing the flow of the mixture of the carrier gas and the precursor to the photoresist layer using a gas showerhead. In some embodiments, the carrier gas comprises inert gas or nitrogen gas.

In some embodiments, a method of manufacturing a semiconductor device includes the following steps. A photoresist layer is formed over a material layer on a substrate, wherein the photoresist layer comprises a transition metal complex having a metal-carbon bond. A region of the photoresist layer is crosslinked using an EUV radiation. The region of the photoresist layer is crosslinked using an organic compound. The photoresist layer is developed. The material layer is etched using the photoresist layer as a mask. In some embodiments, the organic compound has a volatile composition. In some embodiments, the method further includes baking the photoresist layer after crosslinking the region of the photoresist layer using the organic compound. In some embodiments, the organic compound comprises benzene, toluene, ethylbenzene, propylbenzene, isopropylbenzene, hydroxybenzene, benzaldehyde, carboxybenzene, aminobenzene, nitrobenzene, sulfobenzol, thiophenol, chlorobenzene, bromobenzene, or iodobenzene. In some embodiments, crosslinking the region of the photoresist layer using the organic compound comprises resting the substrate in a manufacturing tool having a container with the organic compound stored therein. In some embodiments, the manufacturing tool is a front opening unified pod (FOUP).

In some embodiments, a method of patterning a substrate includes the following steps. A metal-containing photoresist layer is spin coated on a substrate. The metal-containing photoresist layer is exposed. A gas is provided to react with the metal-containing photoresist layer. The metal-containing photoresist layer is developed. The substrate is etched using the metal-containing photoresist layer as a mask to form strips. In some embodiments, the metal-containing photoresist layer is in contact with the substrate. In some embodiments, the gas is a mixture including a carrier gas and a volatile compound. In some embodiments, providing the gas is performed after exposing the metal-containing photoresist layer. In some embodiments, providing the gas is performed using a bubbler-type apparatus. In some embodiments, providing the gas is performed using a manifold having a plurality of openings through which the gas flows, and the plurality of openings is arranged in a row and column arrangement. In some embodiments, the metal-containing photoresist layer comprises a tin cation bonded to an organic ligand.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a photoresist layer over a material layer on a substrate;
    exposing the photoresist layer;
    performing an organic treatment to the photoresist layer using benzene, derivatives of benzene, or a combination thereof;
    after performing the organic treatment, developing the photoresist layer; and
    etching the material layer using the photoresist layer as a mask.

2. The method of claim 1, wherein the organic treatment is performed without heating the photoresist layer.

3. The method of claim 1, wherein the photoresist layer comprises a metallic resist having a metal-carbon bond, and the organic treatment is performed such that the metal-carbon bond has a homolytic cleavage.

4. The method of claim 1, wherein performing the organic treatment comprises:
transferring the substrate to a chamber connected to a bubbler, wherein the bubbler comprises a precursor; and
introducing a carrier gas into the bubbler such that a flow of a mixture of the carrier gas and the precursor is directed into the chamber.

5. The method of claim 4, wherein performing the organic treatment further comprises:
directing the flow of the mixture of the carrier gas and the precursor to the photoresist layer using a gas showerhead.

6. The method of claim 4, wherein the carrier gas comprises nitrogen gas.

7. The method of claim 1, wherein the derivatives of benzene comprises methylbenzene.

8. A method of manufacturing a semiconductor device, comprising:
forming a photoresist layer over a material layer on a substrate, wherein the photoresist layer comprises a transition metal complex having a metal-carbon bond;
crosslinking a region of the photoresist layer using an EUV radiation;
crosslinking the region of the photoresist layer using an organic compound, wherein the organic compound comprises benzene, toluene, ethylbenzene, propylbenzene, isopropylbenzene, hydroxybenzene, benzaldehyde, carboxybenzene, aminobenzene, nitrobenzene, sulfobenzol, thiophenol, chlorobenzene, bromobenzene, or iodobenzene;
developing the photoresist layer; and
etching the material layer using the photoresist layer as a mask.

9. The method of claim 8, wherein the organic compound has a volatile composition.

10. The method of claim 8, further comprising:
baking the photoresist layer after crosslinking the region of the photoresist layer using the organic compound.

11. The method of claim 8, wherein crosslinking the region of the photoresist layer using the organic compound comprises:
resting the substrate in a manufacturing tool having a container with the organic compound stored therein.

12. The method of claim 11, wherein the manufacturing tool is a front opening unified pod (FOUP).

13. The method of claim 11, wherein resting the substrate in the manufacturing tool comprises disposing the substrate on a top side of the manufacturing tool.

14. A method of patterning a substrate, comprising:
spin coating a metal-containing photoresist layer on a substrate;
exposing the metal-containing photoresist layer;
providing a gas to react with the metal-containing photoresist layer, wherein the gas comprises benzene, derivatives of benzene, or a combination thereof;
developing the metal-containing photoresist layer; and
etching the substrate using the metal-containing photoresist layer as a mask to form strips.

15. The method of claim 14, wherein the metal-containing photoresist layer is in contact with the substrate.

16. The method of claim 14, wherein the gas further comprises a carrier gas.

17. The method of claim 14, wherein providing the gas is performed after exposing the metal-containing photoresist layer.

18. The method of claim 14, wherein providing the gas is performed using a bubbler-type apparatus.

19. The method of claim 14, wherein providing the gas is performed using a manifold having a plurality of openings through which the gas flows, and the plurality of openings is arranged in a row and column arrangement.

20. The method of claim 14, wherein the metal-containing photoresist layer comprises a tin cation bonded to an organic ligand.

* * * * *